United States Patent
Hopper et al.

(10) Patent No.: US 8,378,460 B2
(45) Date of Patent: Feb. 19, 2013

(54) METHOD OF BATCH TRIMMING CIRCUIT ELEMENTS

(75) Inventors: Peter J. Hopper, San Jose, CA (US);
Peter Johnson, Sunnyvale, CA (US);
Peter Smeys, San Jose, CA (US);
William French, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 104 days.

(21) Appl. No.: 12/978,492

(22) Filed: Dec. 24, 2010

(65) Prior Publication Data
US 2012/0161294 A1    Jun. 28, 2012

(51) Int. Cl.
*H01L 23/48* (2006.01)
*H01L 23/544* (2006.01)
*H01L 21/66* (2006.01)

(52) U.S. Cl. ............. 257/620; 257/773; 257/E23.011; 257/E23.179

(58) Field of Classification Search .......... 257/620, 257/773, E23.011, E23.179
See application file for complete search history.

(56) References Cited

U.S. PATENT DOCUMENTS

| | | | | |
|---|---|---|---|---|
| 6,251,236 | B1 * | 6/2001 | Stevens | 204/224 R |
| 6,444,101 | B1 * | 9/2002 | Stevens et al. | 204/224 R |
| 2005/0056544 | A1 * | 3/2005 | Liu et al. | 205/223 |

* cited by examiner

*Primary Examiner* — Peniel M Gumedzoe
(74) *Attorney, Agent, or Firm* — Eugene C. Conser; Wade J. Brady, III; Frederick J. Telecky, Jr.

(57) ABSTRACT

Multiple wafers that each has multiple high-precision circuits and corresponding trim control circuits are batch trimmed in a process where each wafer is formed to include openings that expose trimmable circuit elements that are internal to the circuitry of the high-precision circuits. The high-precision circuits and trim control circuits are electrically activated during the trimming phase by metal traces that run along the saw streets. The method attaches a wafer contact structure to each wafer to electrically activate the metal traces. The method places the wafers with the wafer contact structures into a solution where the exposed trimmable circuit elements are electroplated or anodized when the actual output voltage of a high-precision circuit does not match the predicted output voltage of the high-precision circuit.

5 Claims, 33 Drawing Sheets

METHOD OF BATCH TRIMMING CIRCUIT ELEMENTS

BACKGROUND OF THE INVENTION

1. Field of the Invention

The present invention relates to the trimming of circuit elements and, more particularly, to a method of batch trimming circuit elements.

2. Description of the Related Art

Many high-precision circuits require that elements within the circuits be trimmed before the circuits can output a precise result. One of the circuit elements that is most commonly trimmed is a resistor. Resistors are trimmed to have a specific resistance, or to have a resistance that matches the resistance of another resistor. One of the most commonly used approaches for trimming a resistor is laser trimming.

FIGS. 1A-1C show views that illustrate an example of a conventional method of laser trimming. FIG. 1A shows a plan view that illustrates an example of a resistor 100 which has not been laser trimmed. FIG. 1B shows a plan view that illustrates an example of resistor 100 after one round of laser trimming. FIG. 1C shows a plan view that illustrates an example of resistor 100 after multiple rounds of laser trimming.

The method begins by applying known input conditions to a trimmable circuit, measuring the actual voltage that is output from the trimmable circuit, and then comparing the actual voltage with the predicted voltage which should be output from the trimmable circuit in response to the known input conditions.

As shown in FIG. 1A, if the actual output voltage is the same as or within an error tolerance of the predicted voltage, no laser trimming is performed. On the other hand, if the actual output voltage is outside of the error tolerance, the resistance of resistor 100 is increased by removing a portion of resistor 100, known as a mouse bite, with a laser as shown in FIG. 1B.

Following this, the voltage output from the trimmable circuit is again measured. If the actual output voltage is the same as or within the error tolerance of the predicted voltage, then the method is complete. On the other hand, if the actual output voltage remains outside of the error tolerance, then the resistance is further increased by removing another portion of the resistor with the laser, followed by another measurement of the voltage output by the trimmable circuit. As shown in FIG. 1C, several rounds of laser trimming may be necessary before the actual output voltage is the same as or within the error tolerance of the predicted voltage.

Although the process of laser trimming works adequately, one of the drawbacks is that it is quite expensive to laser trim a wafer of trimmable circuits, such as a wafer of op amp circuits. If there are 30,000 integrated circuits on a wafer and each integrated circuit needs to be laser trimmed multiple times, then a significant amount of time is required. As a result, laser trimming can have a very low throughput.

Thus, there is a need for a method of batch trimming circuit elements.

BRIEF DESCRIPTION OF THE DRAWINGS

FIG. 1A is a plan view illustrating an example of a resistor 100 which has not been laser trimmed. FIG. 1B is a plan view illustrating an example of resistor 100 after one round of laser trimming. FIG. 1C is a plan view illustrating an example of resistor 100 after multiple rounds of laser trimming.

FIGS. 3A-3H are views illustrating an example of wafer 300 through a first metal layer in accordance with the present invention. FIG. 3A is a plan view. FIG. 3B is a cross-sectional view of wafer 300 taken along line 3B-3B of FIG. 3A. FIG. 3C is a cross-sectional view of wafer 300 taken along line 3C-3C of FIG. 3A. FIG. 3D is a cross-sectional view of wafer 300 taken along line 3D-3D of FIG. 3A. FIG. 3E is a cross-sectional view of wafer 300 taken along line 3E-3E of FIG. 3A. FIG. 3F is a cross-sectional view of wafer 300 taken along line 3F-3F of FIG. 3A. FIG. 3G is a cross-sectional view of wafer 300 taken along line 3F-3G of FIG. 3A. FIG. 3H is a cross-sectional view of wafer 300 taken along line 3H-3H of FIG. 3A.

FIGS. 4A-4H are views illustrating an example of wafer 300 through a second metal layer in accordance with the present invention. FIG. 4A is a plan view. FIG. 4B is a cross-sectional view of wafer 300 taken along line 4B-4B of FIG. 4A. FIG. 4C is a cross-sectional view of wafer 300 taken along line 4C-4C of FIG. 4A. FIG. 4D is a cross-sectional view of wafer 300 taken along line 4D-4D of FIG. 4A. FIG. 4E is a cross-sectional view of wafer 300 taken along line 4E-4E of FIG. 4A. FIG. 4F is a cross-sectional view of wafer 300 taken along line 4F-4F of FIG. 4A. FIG. 4G is a cross-sectional view of wafer 300 taken along line 4G-4G of FIG. 4A. FIG. 4H is a cross-sectional view of wafer 300 taken along line 4H-4H of FIG. 4A.

FIGS. 5A-5H are views illustrating an example of wafer 300 through a third metal layer in accordance with the present invention. FIG. 5A is a plan view. FIG. 5B is a cross-sectional view of wafer 300 taken along line 5B-5B of FIG. 5A. FIG. 5C is a cross-sectional view of wafer 300 taken along line 5C-5C of FIG. 5A. FIG. 5D is a cross-sectional view of wafer 300 taken along line 5D-5D of FIG. 5A. FIG. 5E is a cross-sectional view of wafer 300 taken along line 5E-5E of FIG. 5A. FIG. 5F is a cross-sectional view of wafer 300 taken along line 5F-5F of FIG. 5A. FIG. 5G is a cross-sectional view of wafer 300 taken along line 5G-5G of FIG. 5A. FIG. 5H is a cross-sectional view of wafer 300 taken along line 5H-5H of FIG. 5A.

FIGS. 6A-6H are views illustrating an example of wafer 300 through a fourth metal layer in accordance with the present invention. FIG. 6A is a plan view. FIG. 6B is a cross-sectional view of wafer 300 taken along line 6B-6B of FIG. 6A. FIG. 6C is a cross-sectional view of wafer 300 taken along line 6C-6C of FIG. 6A. FIG. 6D is a cross-sectional view of wafer 300 taken along line 6D-6D of FIG. 6A. FIG. 6E is a cross-sectional view of wafer 300 taken along line 6E-6E of FIG. 6A. FIG. 6F is a cross-sectional view of wafer 300 taken along line 6F-6F of FIG. 6A. FIG. 6G is a cross-sectional view of wafer 300 taken along line 6G-6G of FIG. 6A. FIG. 6H is a cross-sectional view of wafer 300 taken along line 6H-6H of FIG. 6A.

FIGS. 7A-7H are views illustrating an example of wafer 300 following the formation of a top passivation layer in accordance with the present invention. FIG. 7A is a plan view. FIG. 7B is a cross-sectional view of wafer 300 taken along line 7B-7B of FIG. 7A. FIG. 7C is a cross-sectional view of wafer 300 taken along line 7C-7C of FIG. 7A. FIG. 7D is a cross-sectional view of wafer 300 taken along line 7D-7D of FIG. 7A. FIG. 7E is a cross-sectional view of wafer 300 taken along line 7E-7E of FIG. 7A. FIG. 7F is a cross-sectional view of wafer 300 taken along line 7F-7F of FIG. 7A. FIG. 7G is a cross-sectional view of wafer 300 taken along line 7G-7G of FIG. 7A. FIG. 7H is a cross-sectional view of wafer 300 taken along line 7H-7H of FIG. 7A.

FIG. 9A is a plan view, while FIG. 9B is a cross-sectional view taken along line 9B-9B of FIG. 9A.

DETAILED DESCRIPTION OF THE INVENTION

Figure 1A:
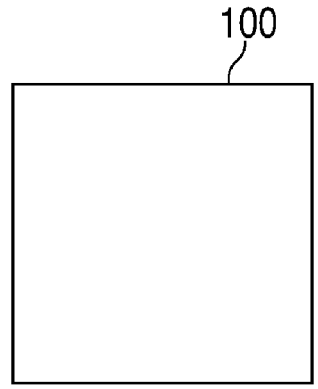
FIGS. 1A-1C are views illustrating an example of a conventional method of laser trimming.
Figure 1B:
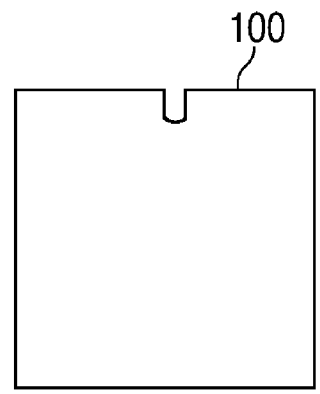
Figure 1C:
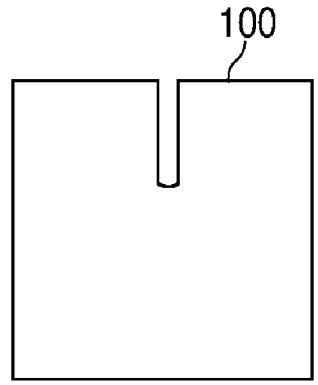
Figure 2A:
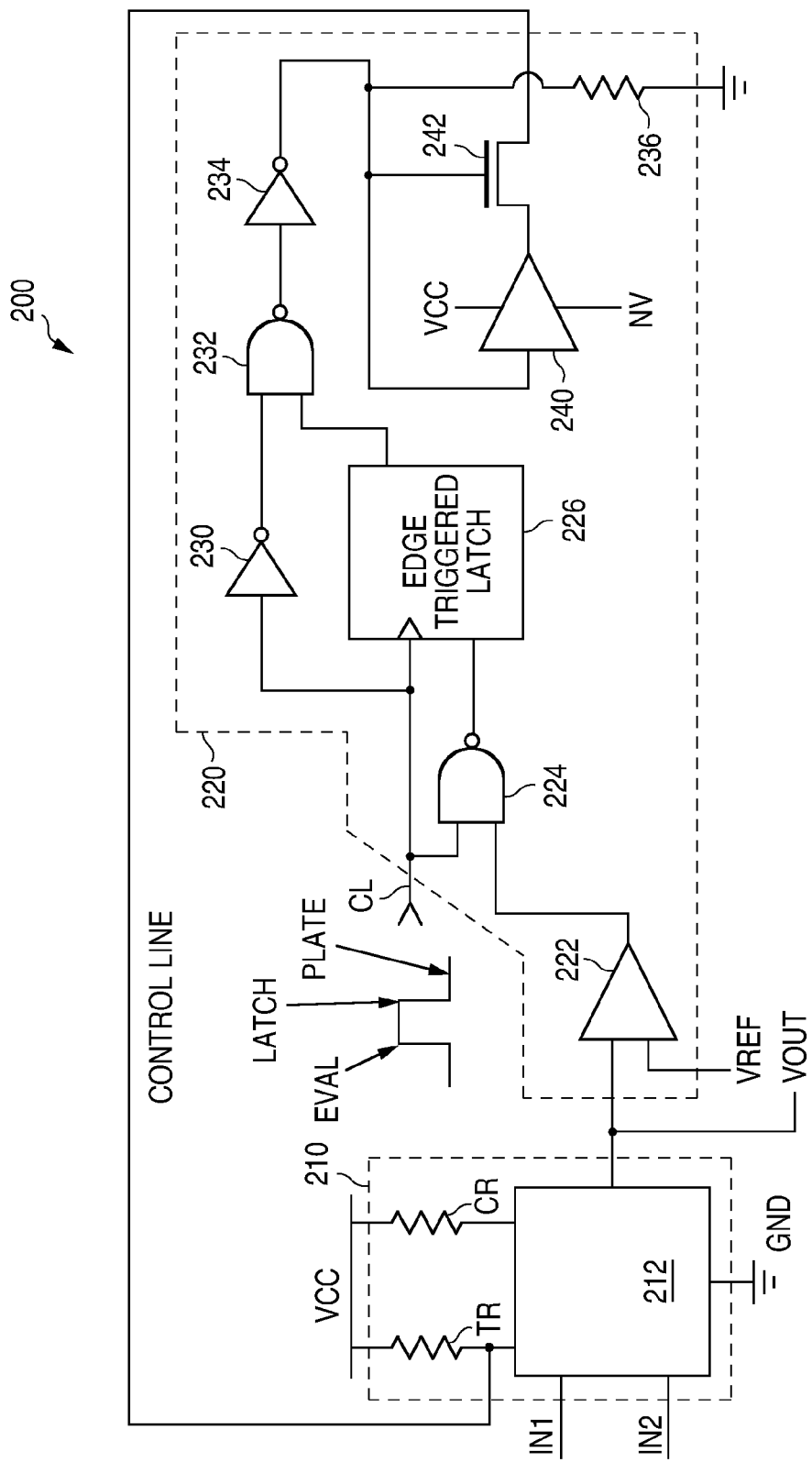
FIG. 2A is a schematic view illustrating an example of a self-trimming circuit 200 in accordance with the present invention.

FIG. 2A shows a schematic view that illustrates an example of a self-trimming circuit 200 in accordance with the present invention. As shown in FIG. 2A, self-trimming circuit 200 includes a trimmable circuit 210. In the present invention, trimmable circuit 210 can be implemented with any circuit where, in response to known input conditions, the value or state of a changeable circuit element within trimmable circuit 210 determines how closely the actual voltage or state output from trimmable circuit 210 matches the predicted voltage or state which should be output from trimmable circuit 210.

The FIG. 2A example illustrates trimmable circuit 210 with a pair of resistors where matching the resistances of the pair of resistors within trimmable circuit 210 determines how closely the actual voltage output from trimmable circuit 210 matches the predicted voltage which should be output from trimmable circuit 210.

In the FIG. 2A example, trimmable circuit 210 includes an electronic circuit 212 that receives an input signal IN1 and an input signal IN2, and generates an output voltage VOUT. Trimmable circuit 210 also includes a control resistor CR and a trimmable resistor TR that are connected to electronic circuit 212. In the present example, in response to known input conditions, the difference between the actual output voltage VOUT and the predicted output voltage is a function of how closely the resistance of the trimmable resistor TR matches the resistance of the control resistor CR, with matching resistances causing the actual output voltage VOUT to match the predicted output voltage.

Trimmable circuit 210 is also connected to a power supply voltage VCC and ground GND. In the present example, the control resistor CR and the trimmable resistor TR are connected to the power supply voltage VCC. Alternately, other circuit elements of electronic circuit 212 can be connected between the control resistor CR and the trimmable resistor TR and the power supply voltage VCC.

As further shown in FIG. 2A, self-trimming circuit 200 also includes a trim control circuit 220 that is connected to trimmable circuit 210. In the present invention, trim control circuit 212 can be implemented with any circuit that compares the actual output voltage or state generated by trimmable circuit 210 to a predicted voltage or state, evaluates the comparison, and places a plating voltage on trimmable resistor TR only when the evaluation indicates that the actual output voltage or state and the predicted voltage or state are unequal and outside of the allowed error tolerance.

In the FIG. 2A example, trim control circuit 220 includes a comparator 222 and a NAND gate 224. Comparator 222 is connected to receive the output voltage VOUT and a reference voltage VREF, while NAND gate 224 is connected to receive the output from comparator 222 and a control line clock CL.

Trim control circuit 220 also includes an edge triggered latch 226 and an inverter 230. Latch 226 has a data input that is connected to receive the output from NAND gate 224, and a clock input that is connected to receive the control line clock CL, while inverter 230 is connected to receive the control line clock CL.

Further, trim control circuit 220 includes a NAND gate 232, an inverter 234, and a resistor 236. NAND gate 232 is connected to receive the output from latch 226 and the output from inverter 230, while inverter 234 is connected to receive the output from NAND gate 232, and resistor 236 is connected between the output of inverter 234 and ground.

In addition, as further shown in FIG. 2A, trim control circuit 220 includes an amplifier 240 and a MOS transistor 242. Amplifier 240 is connected to receive the output from inverter 234, a negative plating voltage NV, such as −5V, and the power supply voltage VCC. Transistor 242, in turn, is connected to the output of inverter 234, the output of amplifier 240, and a portion of trimmable resistor TR.

Figure 2B:
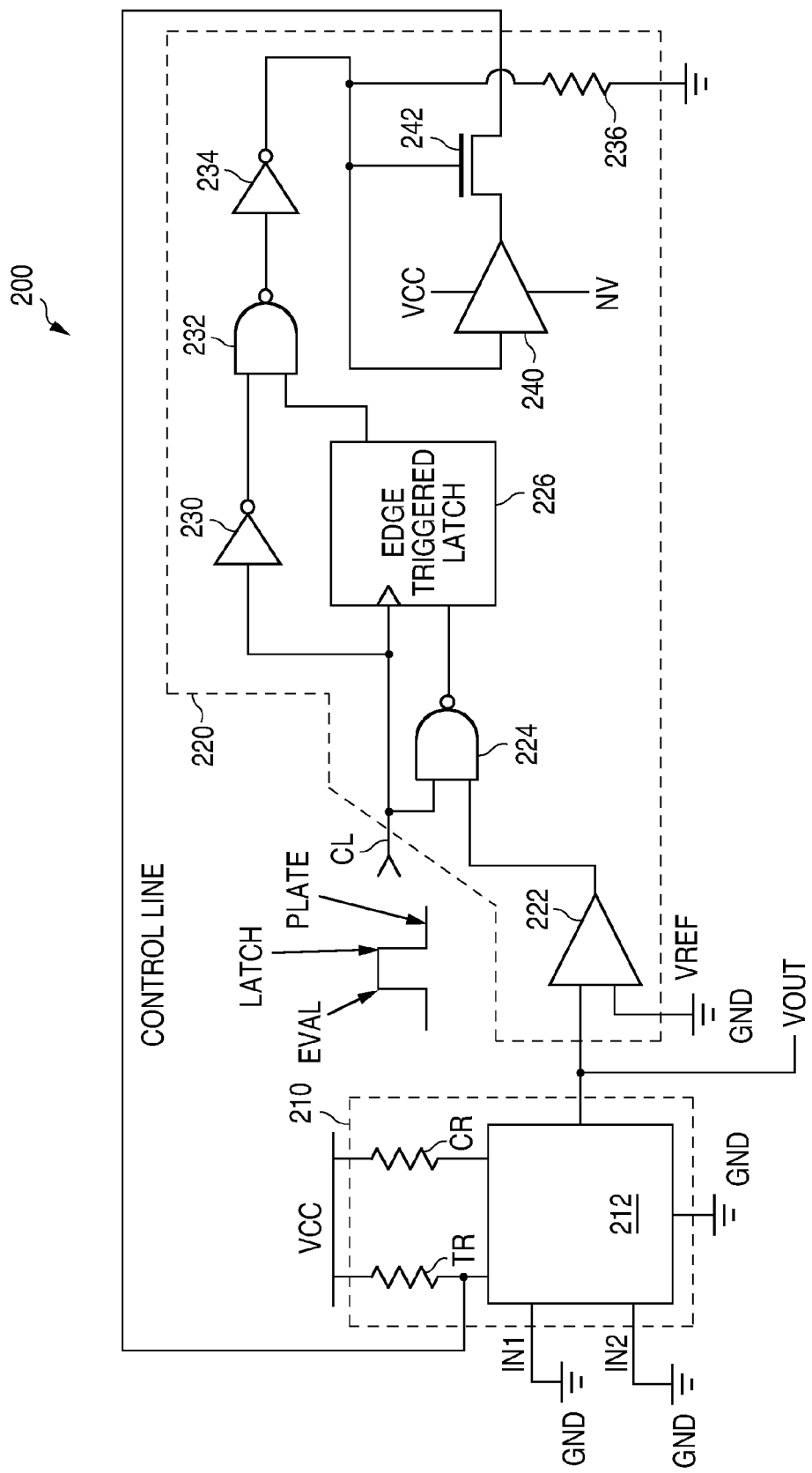
FIG. 2B is a schematic view illustrating an example of a self-trimming circuit 200 with a first set of input conditions in accordance with the present invention.

FIG. 2B shows a schematic view that illustrates an example of a self-trimming circuit 200 with a first set of input conditions in accordance with the present invention. As shown in FIG. 2B, the input signal IN1, the input signal IN2, and the reference voltage VREF are all equal to ground. In the present example, when the input signal IN1 and the input signal IN2 are both equal to ground, the output voltage VOUT is also equal to ground when the resistances of the control resistor CR and the trimmable resistor TR are equal. Circuits which have these characteristics, such as operational amplifiers, are well known in the art.

Figure 2C:
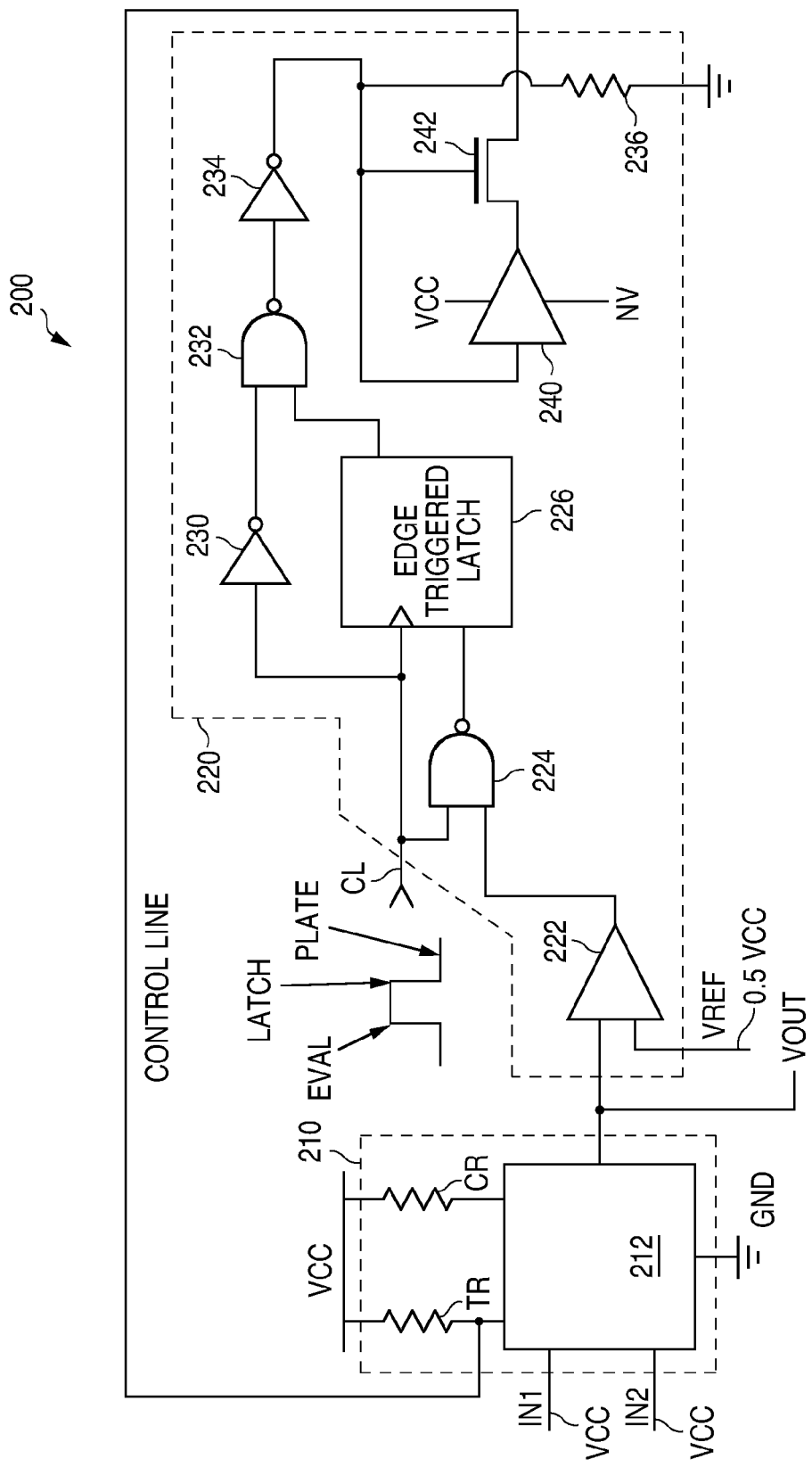
FIG. 2C is a schematic view illustrating an example of a self-trimming circuit 200 with a second set of input conditions in accordance with the present invention.

FIG. 2C shows a schematic view that illustrates an example of a self-trimming circuit 200 with a second set of input conditions in accordance with the present invention. As shown in FIG. 2C, the input signal IN1 and the input signal IN2 are both equal to the power supply voltage VCC, while the reference voltage VREF is equal to one-half the power supply voltage 0.5 VCC.

In the present example, when the input signal IN1 and the input signal IN2 are both equal to the power supply voltage VCC, the output voltage VOUT is equal to one-half the power supply voltage 0.5 VCC when the resistances of the control resistor CR and the trimmable resistor TR are equal. Circuits which have these characteristics, such as a differential pair, are well known in the art.

Figure 2D:
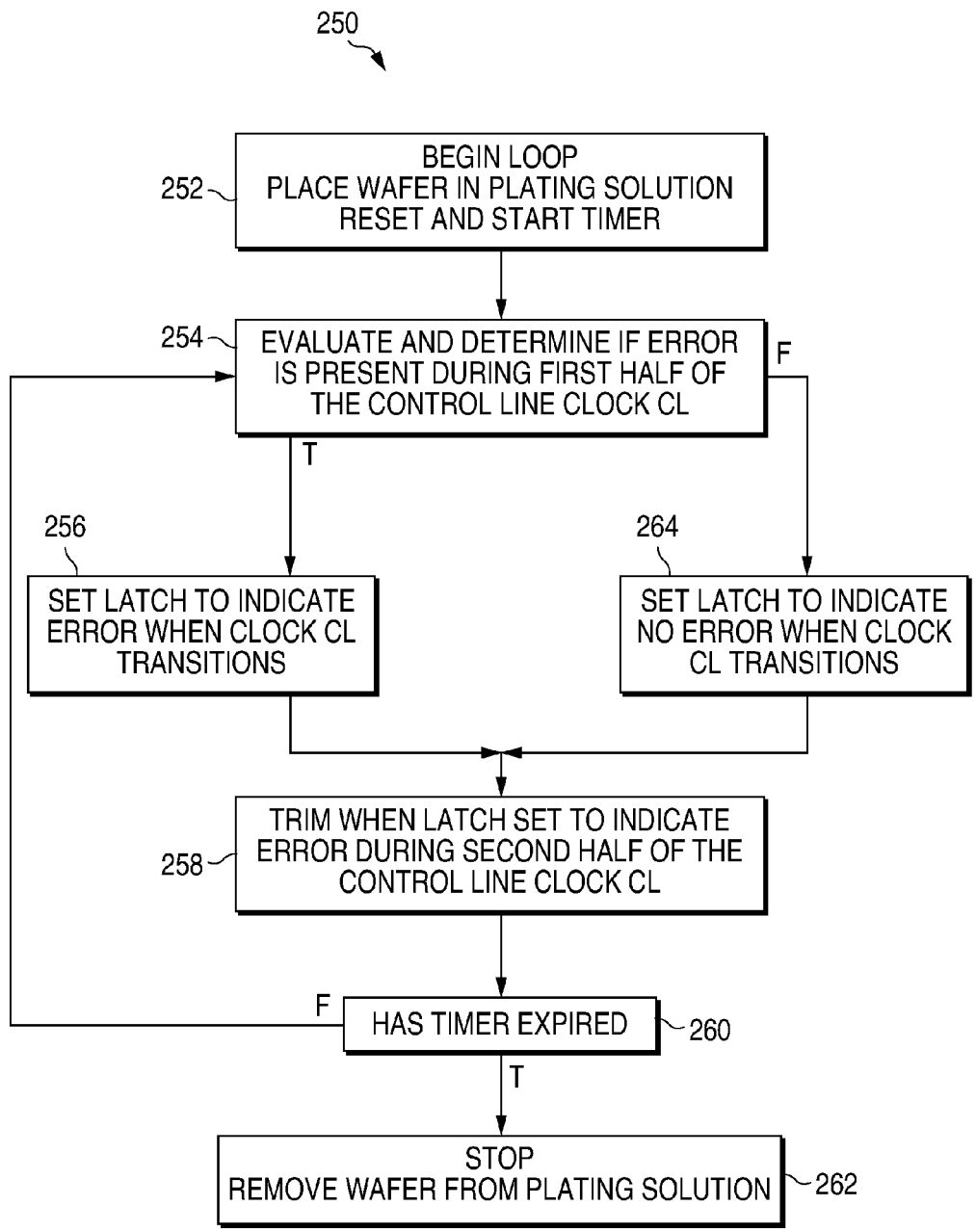
FIG. 2D is a flow chart illustrating an example of a method 250 of operating a self-trimming circuit in accordance with the present invention.

FIG. 2D shows a flow chart that illustrates an example of a method 250 of operating a self-trimming circuit in accordance with the present invention. As shown in FIG. 2D, method 250 begins in 252 by resetting and starting a timer. In the present example, the timer is started after the self-trimming circuit is placed in a plating solution.

Method 250 then moves to 254 to evaluate and determine if an error indication is true or false during the first half of the control line clock CL. As shown in FIGS. 2A, 2B, and 2C, the evaluation and error determination in 254 is performed by comparator 222 of trim control circuit 220, which continuously compares the output voltage VOUT to the reference voltage VREF. In the present example, comparator 222 outputs a logic high or false signal F when the voltages are equal or within an error tolerance, and outputs a logic low or true signal T when the voltages are unequal or outside of the error tolerance.

Thus, in the FIG. 2B example, if the input signal IN1 and the input signal IN2 are both equal to ground, the resistances of the control resistor CR and the trimmable resistor TR are matched, the actual and predicted output voltages are both ground, and the reference voltage VREF is equal to ground, then comparator 222 outputs a logic high or false signal F. On the other hand, when the trimmable resistor TR is more resistive than the control resistor CR, the output voltage VOUT is no longer equal to the reference voltage VREF and comparator 222 outputs the logic low or the true signal T.

In the FIG. 2C example, if the input signal IN1 and the input signal IN2 are both equal to power supply voltage VCC, the resistances of the control resistor CR and the trimmable resistor TR are matched, the actual and predicted output voltages are both one-half the power supply voltage VCC, and the reference voltage VREF is equal to one-half the power supply voltage VCC, then comparator 222 outputs a logic high or false signal F. On the other hand, when the trimmable resistor TR is more resistive than the control resistor CR, the output voltage VOUT is no longer equal to the reference voltage VREF and comparator 222 outputs the logic low or the true signal T.

Referring back to FIG. 2D, when an error is present in 254 (e.g., when comparator 222 outputs the logic low or the true signal T), method 250 moves to 256 to set a latch in 256 when the control line clock CL transitions states to indicate that an error is present, and then moves to 258 to trim trimmable resistor TR during the second half of the control line clock CL.

In the present example, the control line clock CL shown in FIGS. 2A, 2B, and 2C has a logic high evaluation phase, a transition from logic high to logic low, and a logic low plating phase. Thus, the results output from comparator 222 are processed by NAND gate 224 and input to latch 226 during the logic high evaluation phase of the control line clock CL, and then captured by latch 226 during the transition of control line clock CL. The plating of trimmable resistor TR is then performed during the logic low plating phase of the control line clock CL.

Thus, method 250 determines whether an error is present in 254 during the logic high evaluation phase of the control line clock CL, sets a latch in 256 in response to the transition of the control line clock CL to indicate that an error was detected, and trims trimmable resistor TR in 258 during the logic low phase of the control line clock CL when the latch 226 has been set to indicate an error.

For example, when comparator 222 receives unequal voltages, during the evaluation phase, NAND gate 224 generates a logic high as a result of receiving a logic high from the control line clock CL and a logic low from comparator 222 (as a result of unequal input voltages). In addition, latch 226 captures the logic high output from NAND gate 224 in response to the transition of the control line clock CL.

Also during the evaluation phase, inverter 230 outputs a logic low in response to inverting the logic high from the control line clock CL, and NAND gate 232 outputs a logic high in response to the logic low output by inverter 230. Inverter 234 then outputs a logic low in response to the logic high output by NAND gate 232 which, in turn, turns off transistor 242, thereby blocking the output from amplifier 240 during the evaluation phase.

During the plating phase, when the logic state of the control line clock CL falls to a logic low, inverter 230 outputs a logic high from inverting the logic low of the control line clock CL. In addition, the logic high output from inverter 230 and the logic high stored in latch 226 are input to NAND gate 232 which, in turn, generates a logic low.

The logic low output by NAND gate 232 is inverted by inverter 234 to generate a logic high that turns on MOS transistor 242 and causes amplifier to output the negative plating voltage NV. As described in greater detail below, the negative plating voltage NV causes metal to be plated onto trimmable resistor TR which, in turn, lowers the resistance of trimmable resistor TR.

Referring again to FIG. 2D, at the end of the plating phase, method 250 moves from 258 to 260 to determine if the timer has expired. When the timer has expired, method 250 moves to 262 to stop. In the present example, the self-trimming circuit is removed from the plating solution when method 250 moves to stop in 262. Thus, method 250 utilizes a limited number of plating phases to trim trimmable circuit 210.

The true-not-timed-out loop of 254, 256, 258, 260, and 254 shown in FIG. 2D and implemented in FIGS. 2A, 2B, and 2C continues until timed out as long as trimmable resistor TR remains more resistive than control resistor CR (as long as the voltages input to comparator 222 remain unequal).

However, when the resistance of trimmable resistor TR is eventually lowered to equal the resistance of control resistor CR (within the error tolerance), method 250 determines that there is no more error in 254, moves to 264 to set the latch to indicate that an error is not present, and then moves to 258 where further plating is prevented during the second half of the control line clock CL.

As shown in FIGS. 2A, 2B, and 2C, when the resistance of trimmable resistor TR is lowered to equal the resistance of control resistor CR (within the error tolerance), the actual output voltage VOUT and the reference voltage VREF become equal, thereby causing comparator 222 to output a logic high.

During the next evaluation phase of the control line clock CL, when the logic state of the control line clock CL is high, NAND gate 224 outputs a logic low in response to the logic high of the control line clock CL and the logic high output from comparator 222. In addition, latch 226 captures the logic low output from NAND gate 224 in response to the transition of the control line clock CL.

Also during the evaluation phase, inverter 230 outputs a logic low in response to inverting the logic high from the control line clock CL, and NAND gate 232 outputs a logic high in response to the logic low output by inverter 230. Inverter 234 then outputs a logic low in response to the logic high output by NAND gate 232 which, in turn, turns off transistor 242, thereby blocking the output from amplifier 240 during the evaluation phase.

During the next plating phase, when the logic state of the control line clock CL falls to a logic low, inverter 230 outputs a logic high from inverting the logic low of the control line clock CL. In addition, the logic high output from inverter 230 and the logic low stored in latch 226 are input to NAND gate 232 which, in turn, generates a logic high. Inverter 234 then outputs a logic low in response to the logic high output by NAND gate 232 which, in turn, turns off transistor 242, thereby blocking the output from amplifier 240 during the plating phase.

Thus, as long as comparator 222 indicates that the actual output voltage VOUT differs from the reference voltage VREF (by more than the error tolerance), latch 226 stores a logic high which causes amplifier 240 to place the negative plating voltage NV on trimmable resistor TR each time the control line clock CL is low.

However, once comparator 222 indicates that the actual output voltage VOUT equals the reference voltage VREF (or lies within the error tolerance), latch 226 stores a logic low which blocks amplifier 240 from again placing the negative plating voltage NV on trimmable resistor TR each time the control line clock CL is low.

Thus, once the trimmable resistor TR has been trimmed to match the control resistor CR, method 250 prevents further plating from occurring, and continues to loop until the timer expires. Alternately, additional logic can be added to block out the control line clock CL or take other actions to prevent further plating from occurring once the trimmable resistor TR has been trimmed to match the control resistor CR.

Trimmable circuit 210 and trim control circuit 220 both operate during the operation of method 250, but trim control circuit 220 is electrically disconnected after the operation of method 250 has ceased (once the wafer is diced) and does not function during the normal operation of trimmable circuit 210. Resistor 236 is a large value resistor that insures that output of inverter 234 is held to ground after trim control circuit 220 has been electrically disconnected. During the operation of method 250, trimmable circuit 210 operates under normal bias conditions.

Figure 3A:
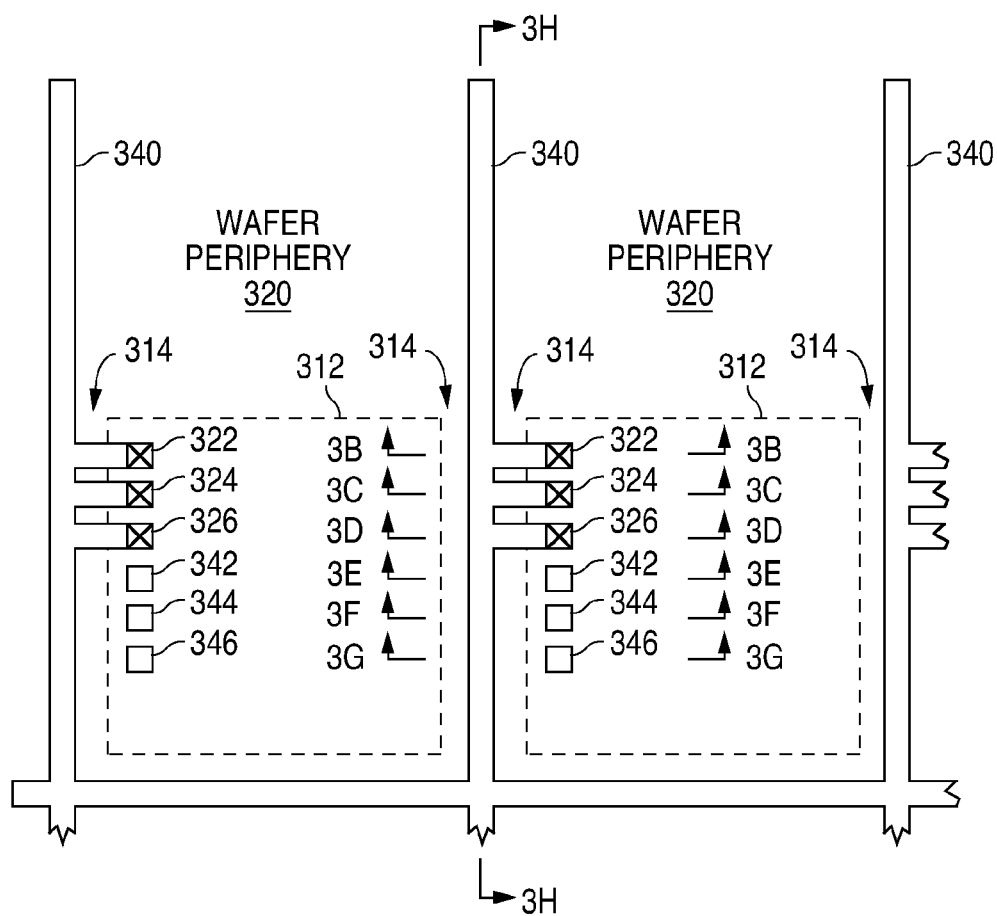
FIGS. 3A-3H, 4A-4H, 5A-5H, 6A-6H, and 7A-7H are a series of views illustrating a semiconductor wafer 300 that implements self-trimming circuit 200 illustrated in FIG. 2B in accordance with the present invention.
Figure 3B:
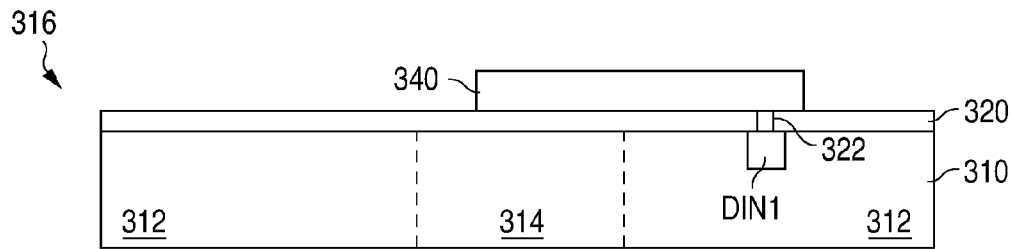
Figure 3C:
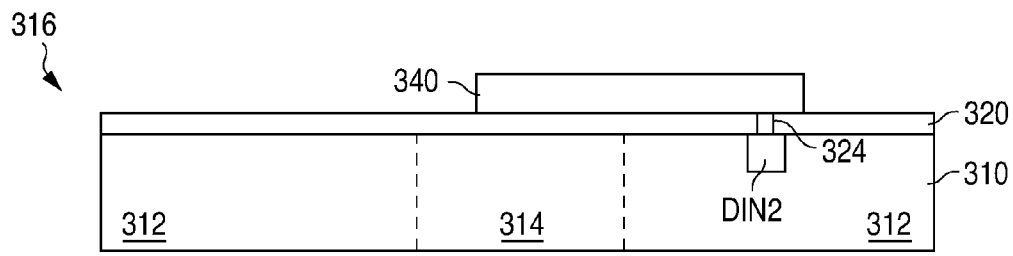
Figure 3D:
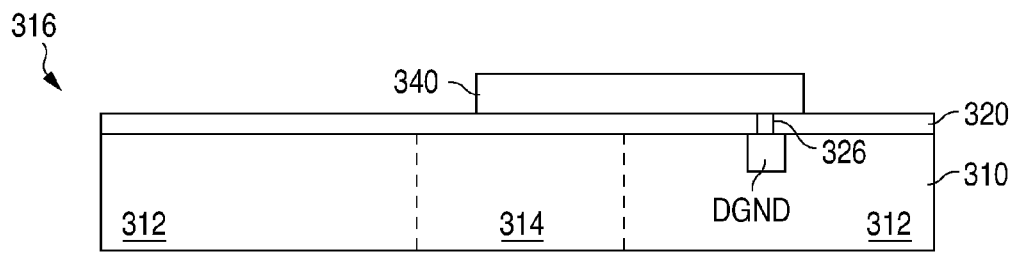
Figure 3E:
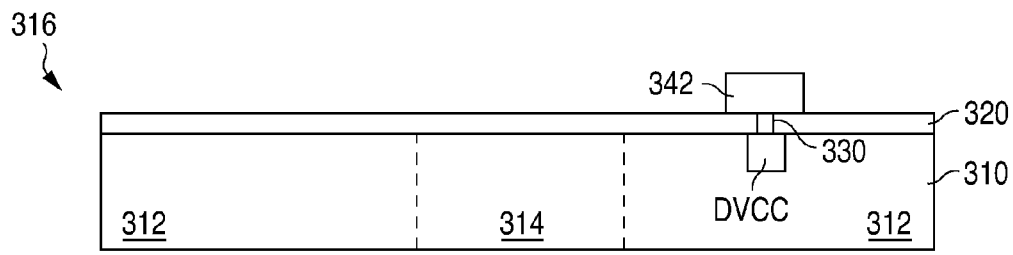
Figure 3F:
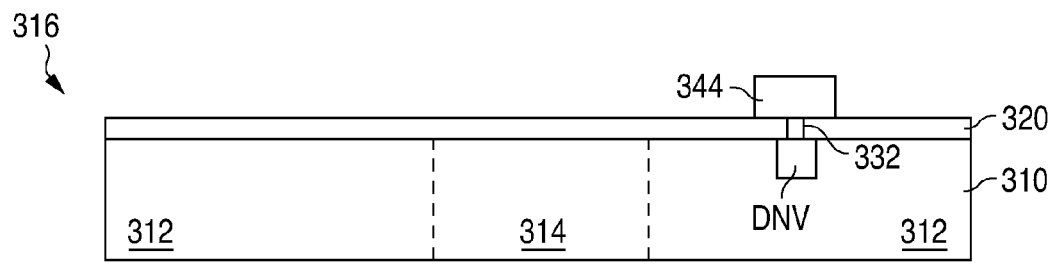
Figure 3G:
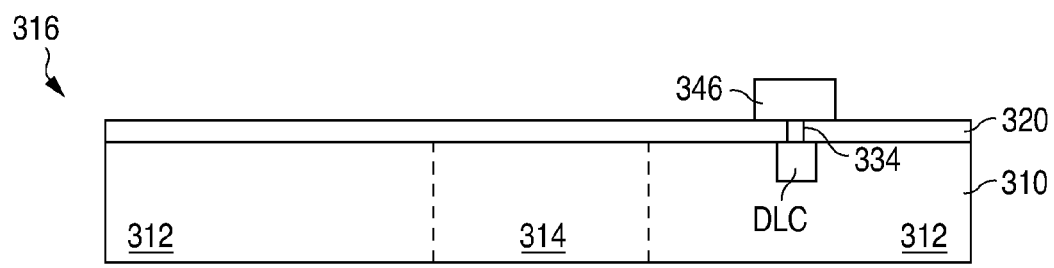
Figure 3H:
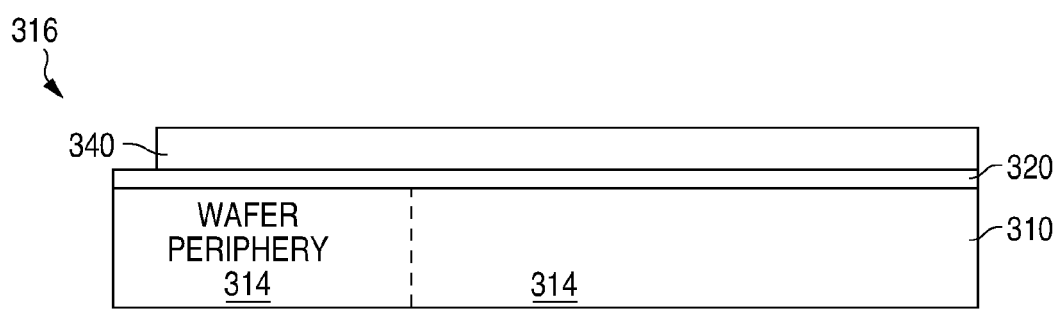

FIGS. 3A-3H, 4A-4H, 5A-5H, 6A-6H, and 7A-7H show a series of views that illustrate a semiconductor wafer 300 that implements self-trimming circuit 200 illustrated in FIG. 2B in accordance with the present invention. FIGS. 3A-3H show views that illustrate an example of wafer 300 through a first metal layer in accordance with the present invention. FIG. 3A shows a plan view. FIG. 3B shows a cross-sectional view of wafer 300 taken along line 3B-3B of FIG. 3A. FIG. 3C shows a cross-sectional view of wafer 300 taken along line 3C-3C of FIG. 3A. FIG. 3D shows a cross-sectional view of wafer 300 taken along line 3D-3D of FIG. 3A. FIG. 3E shows a cross-sectional view of wafer 300 taken along line 3E-3E of FIG. 3A. FIG. 3F shows a cross-sectional view of wafer 300 taken along line 3F-3F of FIG. 3A. FIG. 3G shows a cross-sectional view of wafer 300 taken along line 3F-3G of FIG. 3A. FIG. 3H shows a cross-sectional view of wafer 300 taken along line 3H-3H of FIG. 3A.

As shown in FIGS. 3A-3H, wafer 300 has a substrate 310 that is conventionally formed. Substrate 310, in turn, has an array of spaced-apart integrated circuit regions 312, and a saw street region 314 that laterally surrounds each integrated circuit region 312. (Only two integrated circuit regions 312 at the periphery of wafer 300 are shown for simplicity.) At the conclusion of the fabrication process, a number of individual integrated circuits are formed by vertically and horizontally cutting the saw street region 314 of wafer 300 with a wafer saw.

In addition, wafer 300 includes a number of self-trimming circuits in each integrated circuit region 312. Each self-trimming circuit, in turn, can be implemented with a trimmable circuit 210 and a trim control circuit 220. Each trimmable circuit 210 includes a doped region DIN1 which is the doped region for the input signal IN1, and a doped region DIN2 which is the doped region for the input signal IN2.

In addition, each trim control circuit 220 includes a doped region DNV which is the doped region for the negative plating voltage NV, and a doped region DLC which is the doped region for the line control clock LC. Further, each trimmable circuit 210 and trim control circuit 220 include a number of doped regions DVCC which are the doped regions for the power supply voltage VCC, and a number of doped regions DGND which are the doped regions for ground GND. (Only one doped region DVCC and one doped region DGND are shown for simplicity.) The doped regions have a higher dopant concentration than the dopant concentration of substrate 310, and can include an overlying layer of silicide.

As additionally shown in FIGS. 3A-3H, wafer 300 includes a metal interconnect structure 316 which, in turn, includes a dielectric layer 320 that touches the top surface of substrate 310 over the integrated circuit regions 312 and the saw street region 314. Metal interconnect structure 316 further includes a number of contacts that lie over each integrated circuit region 312 and extend through dielectric layer 320.

The contacts that lie over each integrated circuit region 312 include a contact 322 that extends through dielectric layer 320 to make an electrical connection with doped region DIN1, a contact 324 that extends through dielectric layer 320 to make an electrical connection with doped region DIN2, and a contact 326 that extends through dielectric layer 320 to make an electrical connection with doped region DGND.

The contacts that lie over each integrated circuit region 312 also include a contact 330 that extends through dielectric layer 320 to make an electrical connection with doped region DVCC, a contact 332 that extends through dielectric layer 320 to make an electrical connection with doped region DNV, and a contact 334 that extends through dielectric layer 320 to make an electrical connection with doped region DLC.

In addition, metal interconnect structure 316 includes a metal-1 trace 340 that touches the top surface of dielectric layer 320, and lies over the saw street region 314 and a part of the integrated circuit regions 312 to extend over and make an electrical connection to each contact 322 (to make electrical connections to the doped regions DIN1), each contact 324 (to make electrical connections to the doped regions DIN2), and each contact 326 (to make electrical connections to the doped regions DGND).

Further, metal interconnect structure 316 includes a number of metal-1 structures that lie over each integrated circuit region 312. The metal-1 structures include a metal-1 structure 342 that touches the top surface of dielectric layer 320 and makes an electrical connection to the contact 330 (to make an electrical connection to doped region DVCC), a metal-1 structure 344 that touches the top surface of dielectric layer 320 and makes an electrical connection to the contact 332 (to make an electrical connection to doped region DNV), and a metal-1 structure 346 that touches the top surface of dielectric layer 320 and makes an electrical connection to the contact 334 (to make an electrical connection to doped region DLC).

Figure 4A:
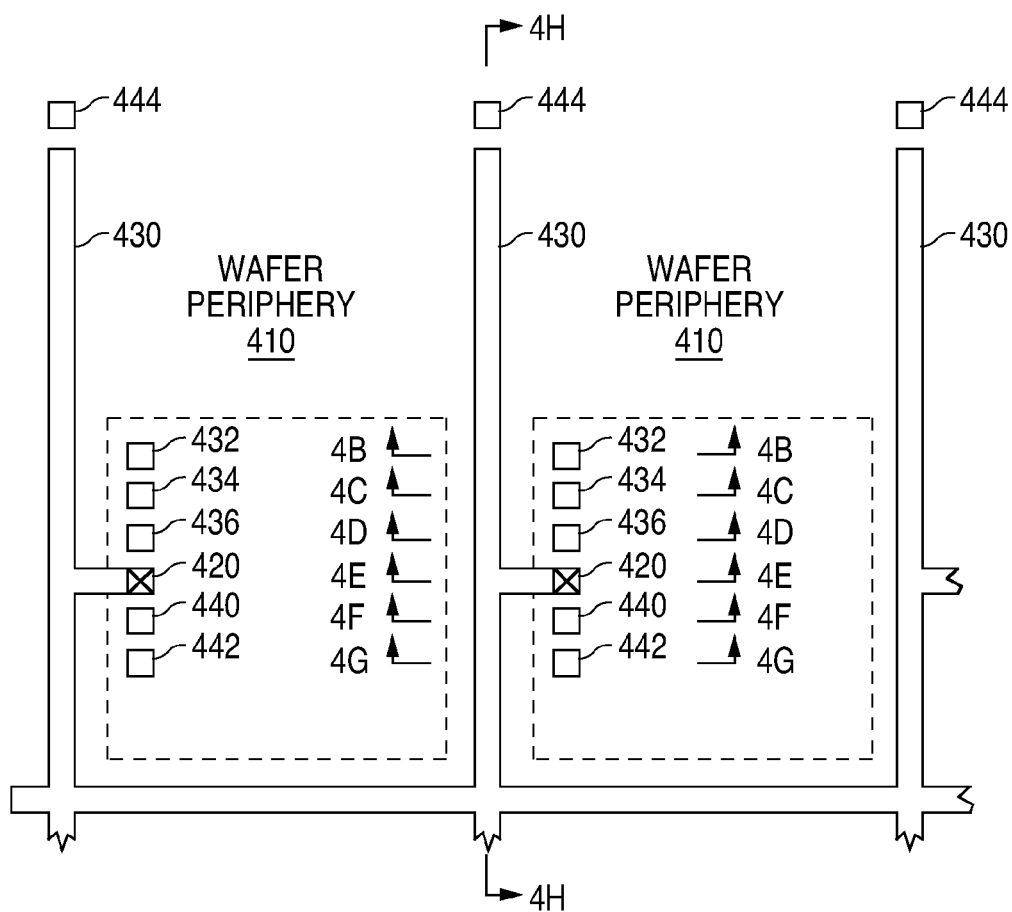
Figure 4B:
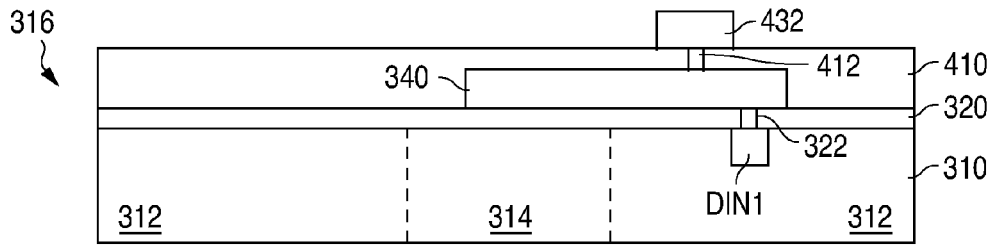
Figure 4C:
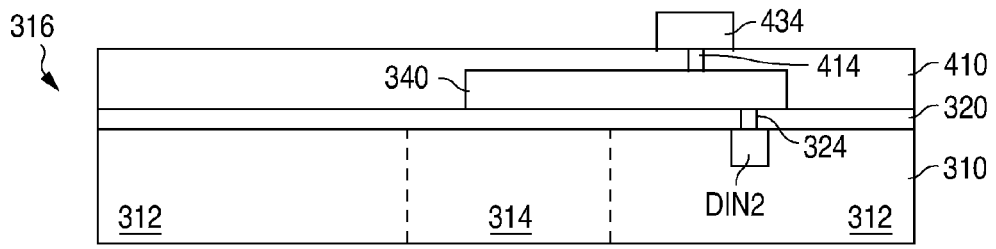
Figure 4D:
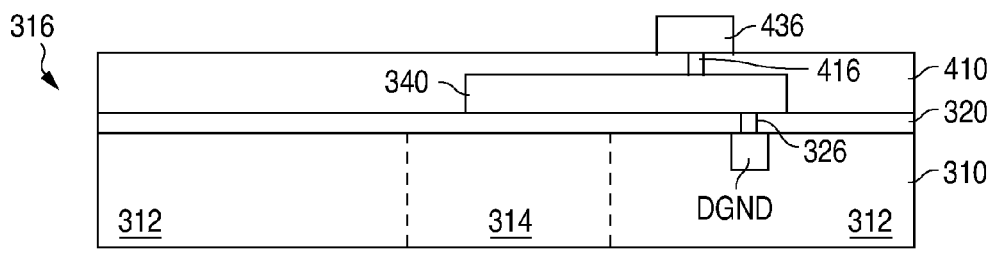
Figure 4E:
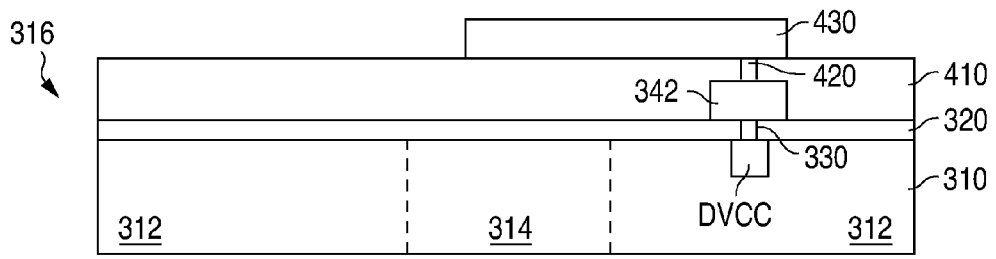
Figure 4F:
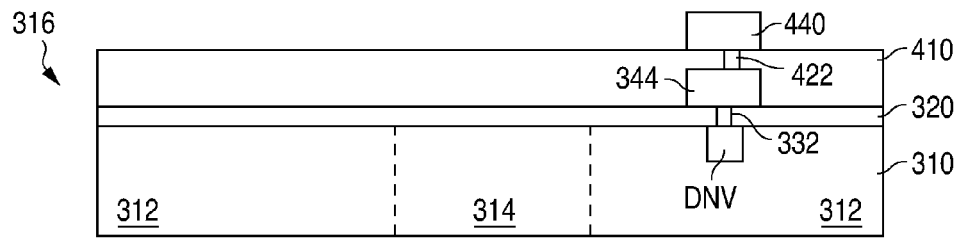
Figure 4G:
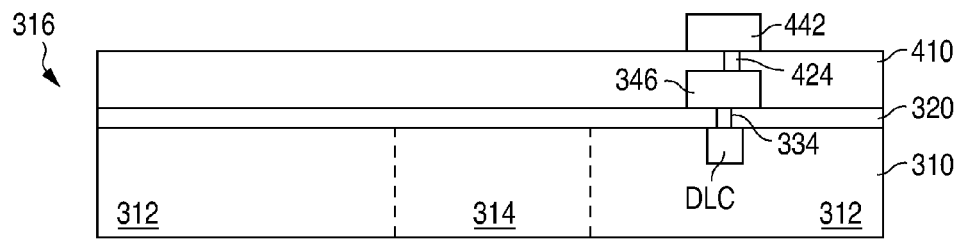
Figure 4H:
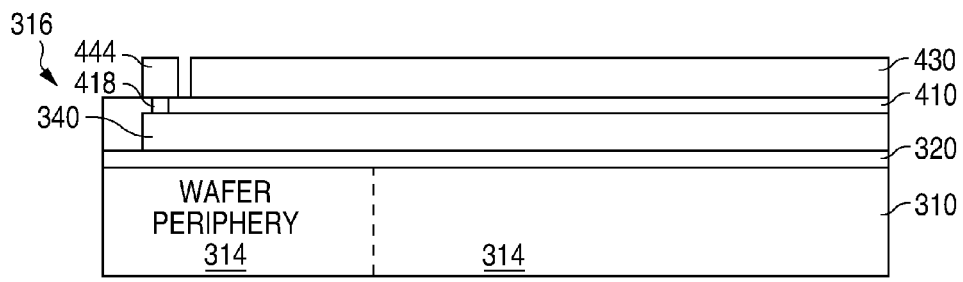

FIGS. 4A-4H show views that illustrate an example of wafer 300 through a second metal layer in accordance with the present invention. FIG. 4A shows a plan view. FIG. 4B shows a cross-sectional view of wafer 300 taken along line 4B-4B of FIG. 4A. FIG. 4C shows a cross-sectional view of wafer 300 taken along line 4C-4C of FIG. 4A. FIG. 4D shows a cross-sectional view of wafer 300 taken along line 4D-4D of FIG. 4A. FIG. 4E shows a cross-sectional view of wafer 300 taken along line 4E-4E of FIG. 4A. FIG. 4F shows a cross-sectional view of wafer 300 taken along line 4F-4F of FIG. 4A. FIG. 4G shows a cross-sectional view of wafer 300 taken along line 4G-4G of FIG. 4A. FIG. 4H shows a cross-sectional view of wafer 300 taken along line 4H-4H of FIG. 4A.

As shown in FIGS. 4A-4H, metal interconnect structure 316 includes an intermetal dielectric layer 410 that touches metal-1 trace 340 and the metal-1 structures 342, 344, and 346. Metal interconnect structure 316 further includes a number of vias that lie over each integrated circuit region 312 and the saw street region 314.

The vias that lie over each integrated circuit region 312 include vias 412, 414, and 416 that each extends into intermetal dielectric layer 410 to make an electrical connection with metal-1 trace 340. In addition, a number of vias 418 lie over the peripheral saw street region 314 to extend into intermetal dielectric layer 410 and make electrical connections with metal-1 trace 340.

The vias that lie over each integrated circuit region 312 also include a via 420 that extends into intermetal dielectric layer 410 to make an electrical connection with metal-1 structure 342, a via 422 that extends into intermetal dielectric layer 410 to make an electrical connection with metal-1 structure 344, and a via 424 that extends into intermetal dielectric layer 410 to make an electrical connection with metal-1 structure 346.

As further shown in FIGS. 4A-4H, metal interconnect structure 316 additionally includes a number of metal-2 traces. The metal-2 traces include a metal-2 trace 430 that touches the top surface of intermetal dielectric layer 410, and lies over the saw street region 314 and a portion of the integrated circuit regions 312 to extend over and make electrical connections to the vias 420 (to make electrical connections to the doped regions DVCC).

The metal-2 traces also lie over each integrated circuit region 312. There traces include a metal-2 trace 432 that touches the top surface of intermetal dielectric layer 410 and makes an electrical connection to the via 412, a metal-2 trace 434 that touches the top surface of intermetal dielectric layer 410 and makes an electrical connection to the via 414, and a metal-2 trace 436 that touches the top surface of intermetal dielectric layer 410 and makes an electrical connection to the via 416.

In the present example, metal-2 trace 432 is part of the interconnect structure that carries the input signal IN1 during normal operation, metal-2 trace 434 is part of the interconnect structure that carries the input signal IN2 during normal operation, and metal-2 trace 436 is part of the interconnect structure that carries ground during normal operation.

Further, metal interconnect structure 316 includes a number of metal-2 structures that lies over each integrated circuit region 312 and the saw street region 314 and touches the top surface of intermetal dielectric layer 410. The metal-2 structures that lie over each integrated circuit region 312 include a metal-2 structure 440 that touches the top surface of intermetal dielectric layer 410 and makes an electrical connection to the via 422, and a metal-2 structure 442 that touches the top surface of intermetal dielectric layer 410 and makes an electrical connection to the via 424. In addition, a number of metal-2 structures 444 lie over the peripheral saw street region to touch the top surface of intermetal dielectric layer 410 and make electrical connections to the vias 418 in the peripheral saw street region 314.

Figure 5A:
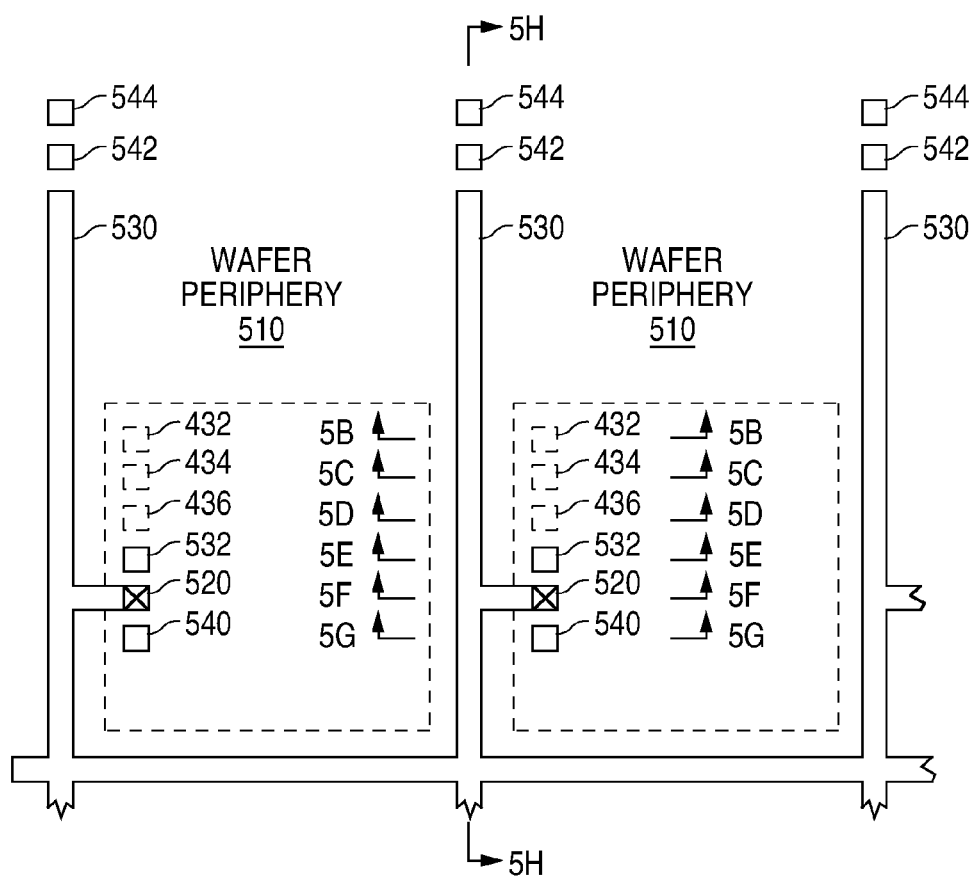
Figure 5B:
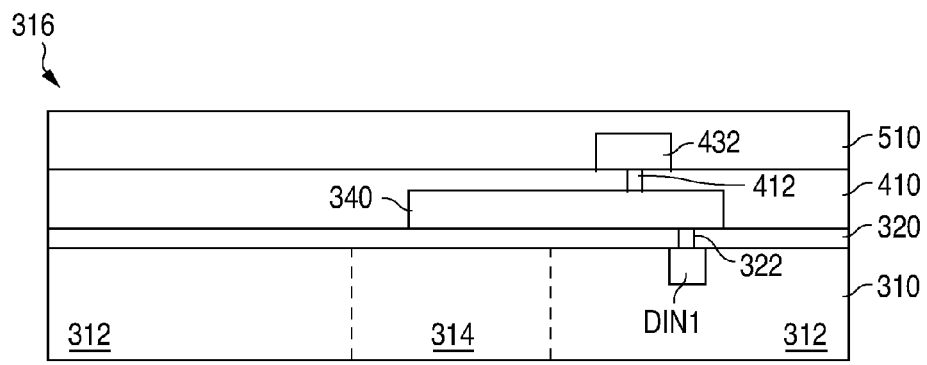
Figure 5C:
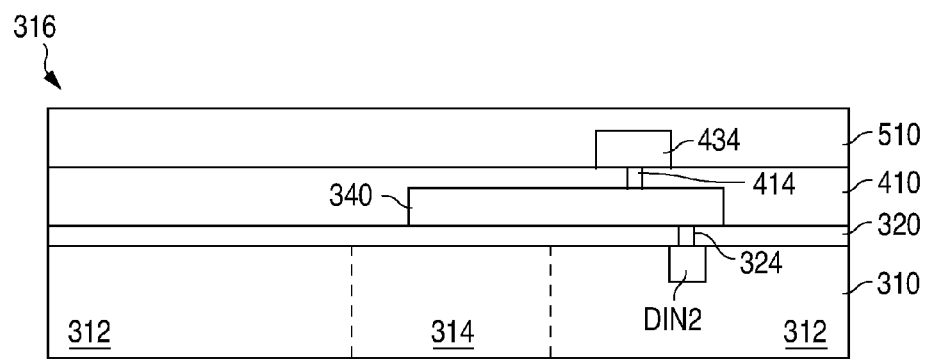
Figure 5D:
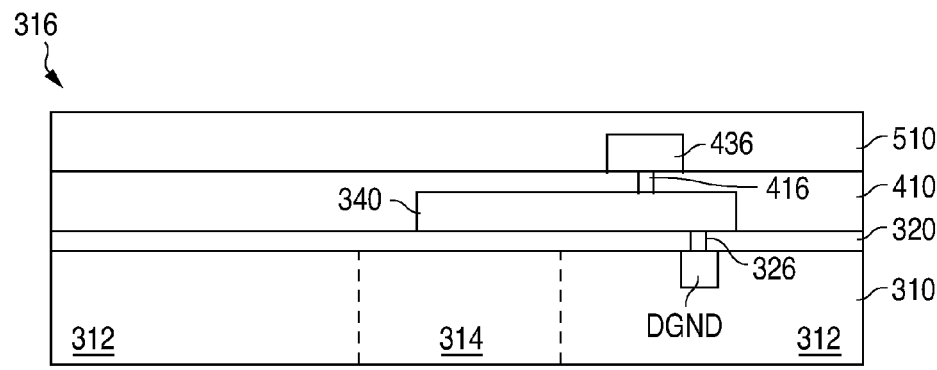
Figure 5E:
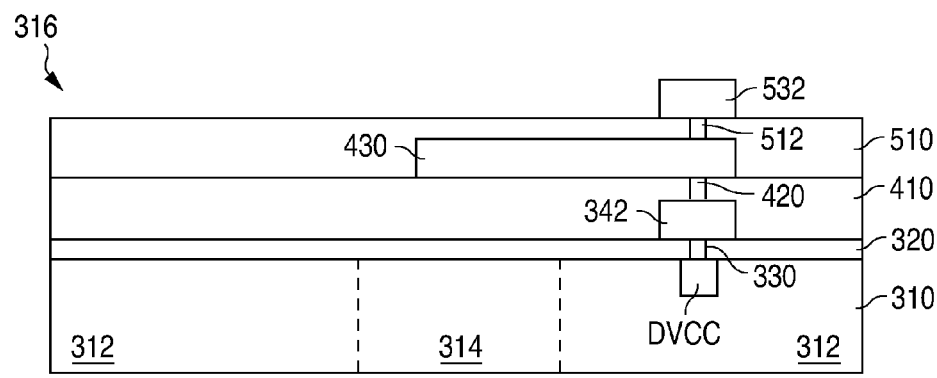
Figure 5F:
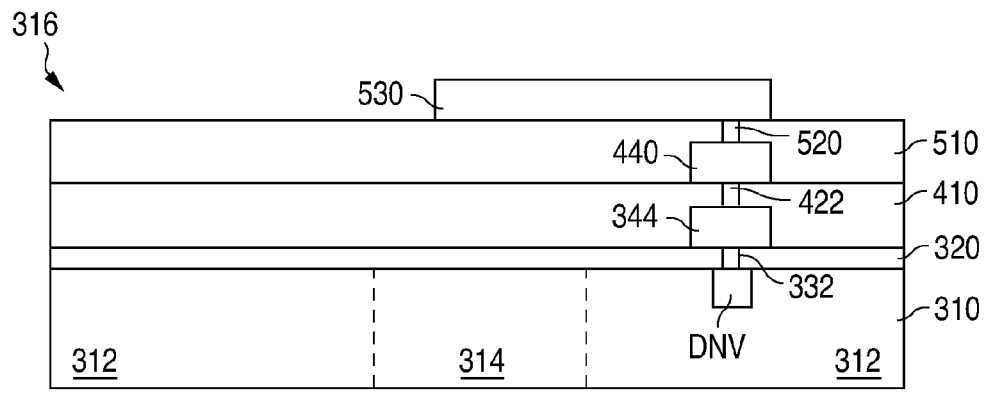
Figure 5G:
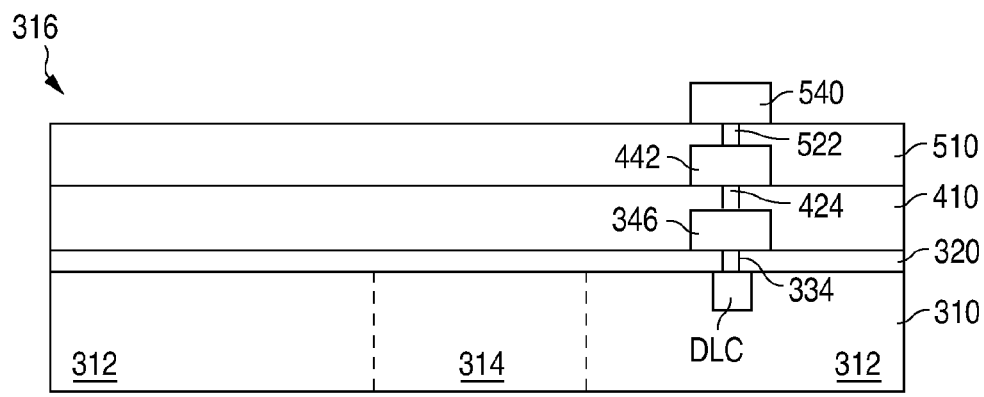
Figure 5H:
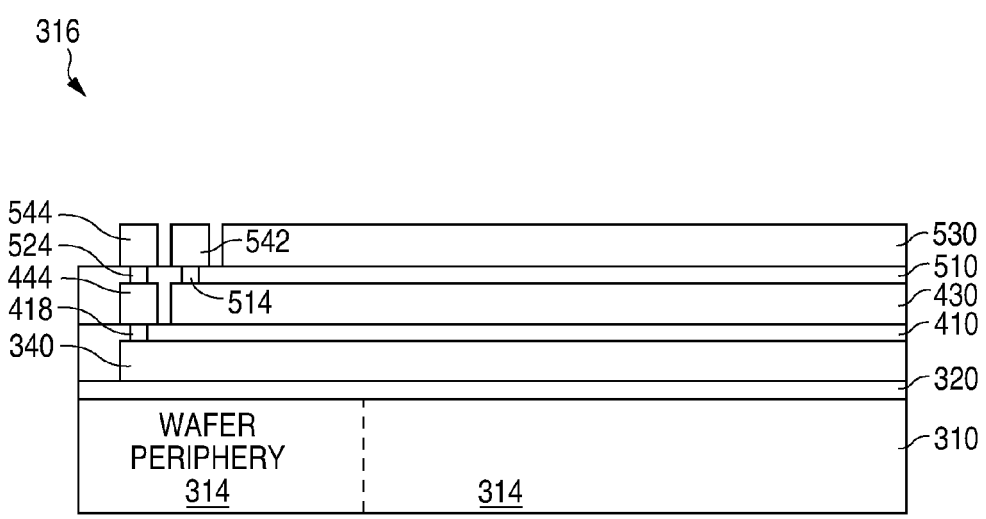

FIGS. 5A-5H show views that illustrate an example of wafer 300 through a third metal layer in accordance with the present invention. FIG. 5A shows a plan view. FIG. 5B shows a cross-sectional view of wafer 300 taken along line 5B-5B of FIG. 5A. FIG. 5C shows a cross-sectional view of wafer 300 taken along line 5C-5C of FIG. 5A. FIG. 5D shows a cross-sectional view of wafer 300 taken along line 5D-5D of FIG. 5A. FIG. 5E shows a cross-sectional view of wafer 300 taken along line 5E-5E of FIG. 5A. FIG. 5F shows a cross-sectional view of wafer 300 taken along line 5F-5F of FIG. 5A. FIG. 5G shows a cross-sectional view of wafer 300 taken along line 5G-5G of FIG. 5A. FIG. 5H shows a cross-sectional view of wafer 300 taken along line 5H-5H of FIG. 5A.

As shown in FIGS. 5A-5H, metal interconnect structure 316 includes an intermetal dielectric layer 510 that touches the metal-2 traces 430, 432, 434, and 436, and the metal-2 structures 440, 442, and 444. Metal interconnect structure 316 further includes a number of vias that lie over the integrated circuit regions 312 and the saw street region 314.

The vias that lie above each integrated circuit region 312 include a via 512 that extends into intermetal dielectric layer 510 to make an electrical connection with metal-2 trace 430, while a number of vias 514 lie over the peripheral saw street region 314 to extend into intermetal dielectric layer 510 and make electrical connections with metal-2 trace 430.

The vias that lie over each integrated circuit region 312 also include a via 520 that extends into intermetal dielectric layer 510 to make an electrical connection with metal-2 structure 440, and a via 522 that extends into intermetal dielectric layer 510 to make an electrical connection with metal-2 structure 442. In addition, a number of vias 524 lie over the peripheral saw street region 314 to extend into intermetal dielectric layer 510 and make electrical connections with the metal-2 structures 444.

As further shown in FIGS. 5A-5H, metal interconnect structure 316 additionally includes a number of metal-3 traces. The metal-3 traces include a metal-3 trace 530 that touches the top surface of intermetal dielectric layer 510, and lies over the saw street region 314 and a part of the integrated circuit regions 312 to extend over and make electrical connections to the vias 520 (to make electrical connections to the doped regions DNV).

The metal-3 traces also include a metal-3 trace 532 that lies over each integrated circuit region 312 to touch the top surface of intermetal dielectric layer 510 and make an electrical connection to the via 512. In the present example, metal-3 trace 532 is part of the interconnect structure that carries the power supply voltage VCC during normal operation.

Further, metal interconnect structure 316 includes a metal-3 structure 540 that lies over each integrated circuit region 312 to touch the top surface of intermetal dielectric layer 510 and make an electrical connection to the via 522. Further, over the peripheral the saw street region 314, a number of metal-3 structures 542 touch the top surface of intermetal dielectric layer 510 and make electrical connections to the vias 514, and a number of metal-3 structures 544 touch the top surface of intermetal dielectric layer 510 and make electrical connections to the vias 524.

Figure 6A:
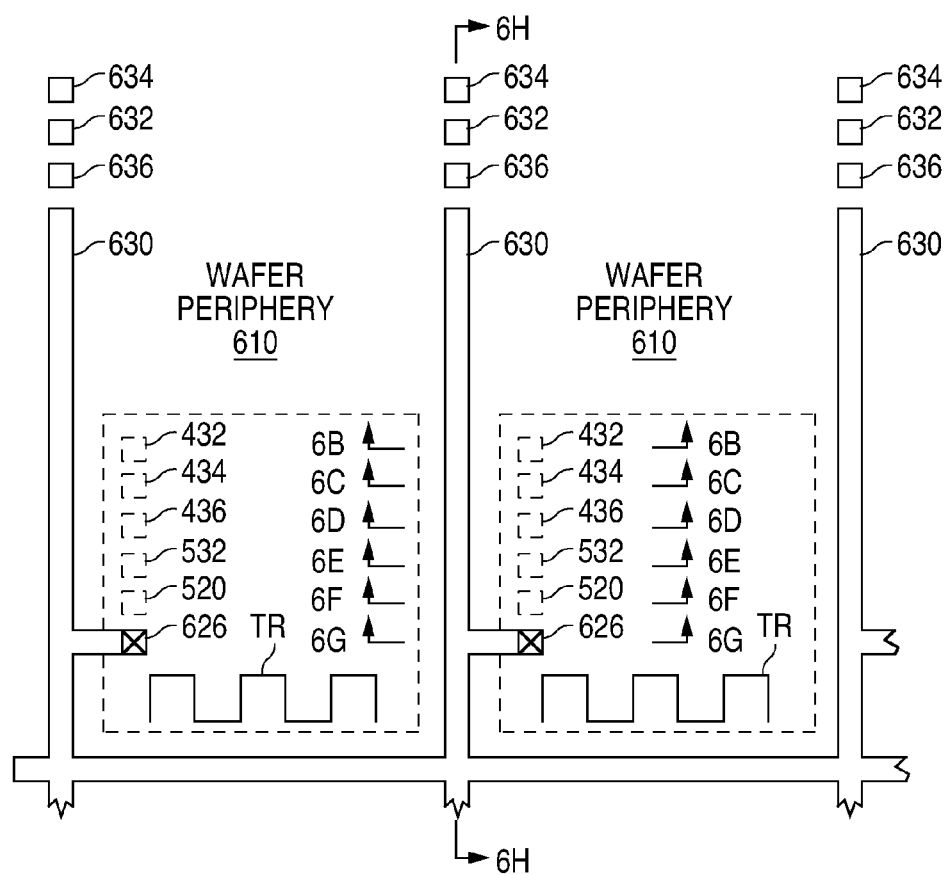
Figure 6B:
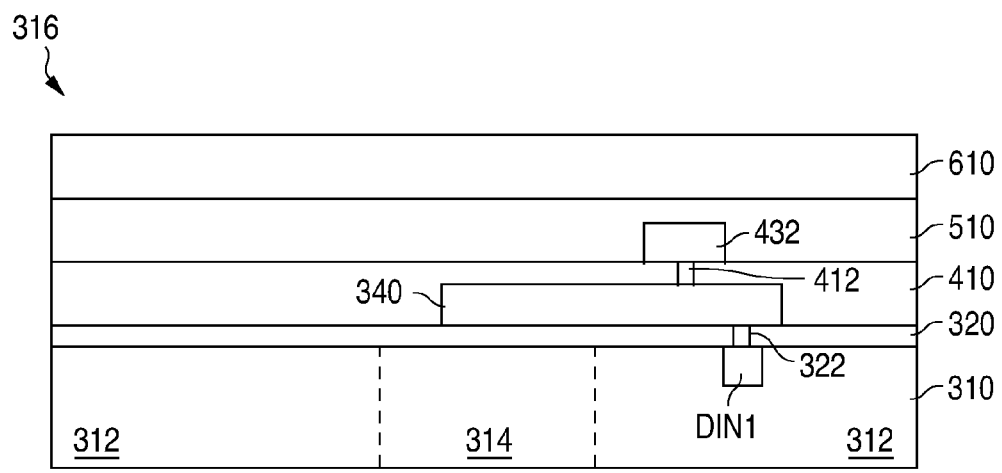
Figure 6C:
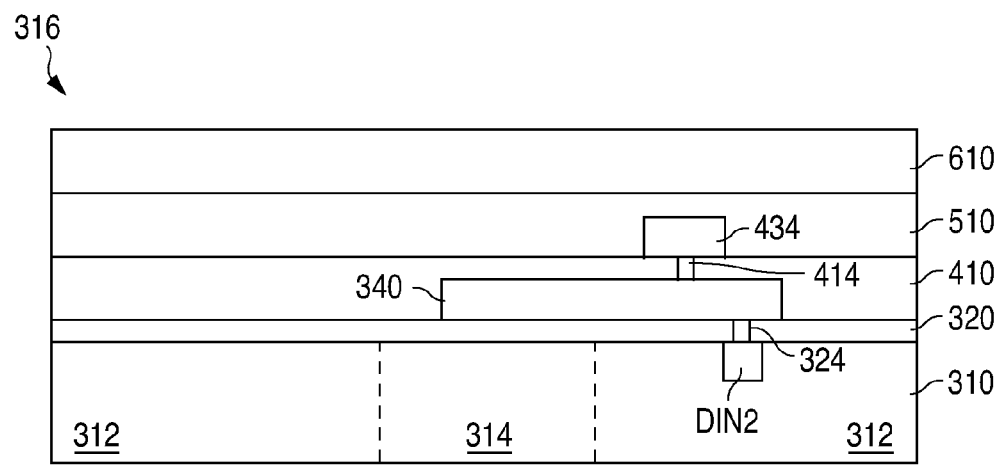
Figure 6D:
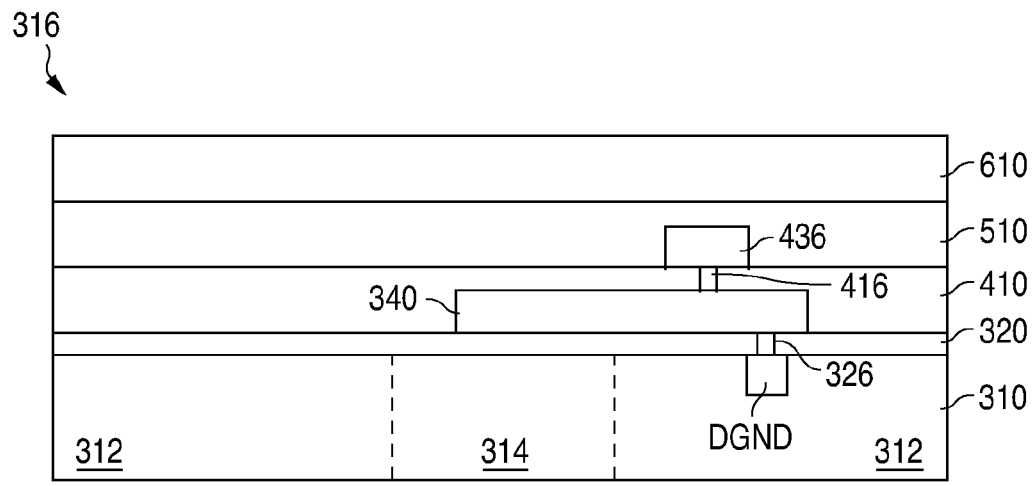
Figure 6E:
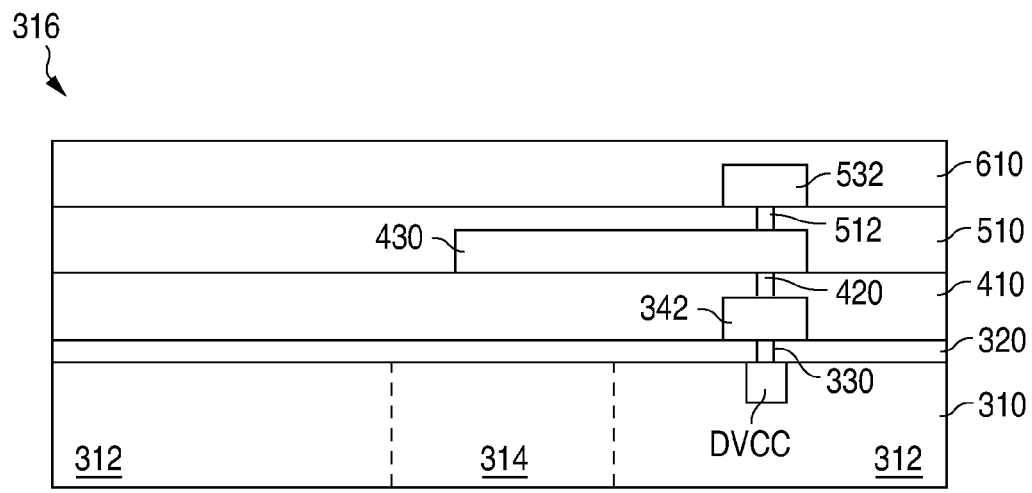
Figure 6F:
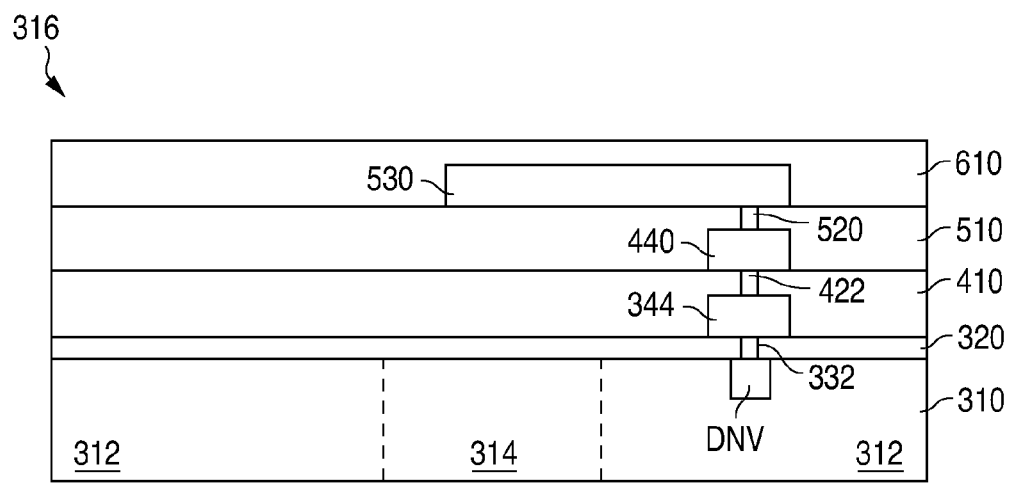
Figure 6G:
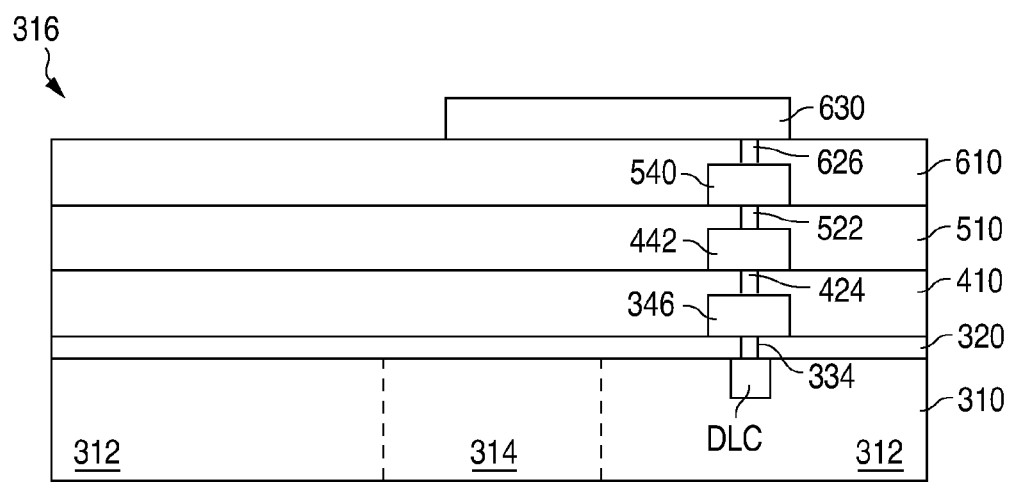
Figure 6H:
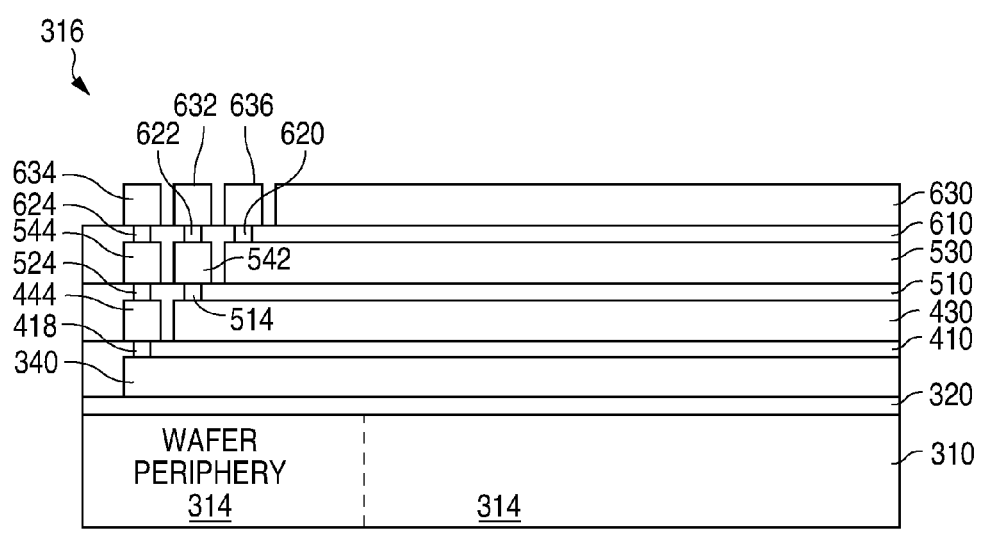

FIGS. 6A-6H show views that illustrate an example of wafer 300 through a fourth metal layer in accordance with the present invention. FIG. 6A shows a plan view. FIG. 6B shows a cross-sectional view of wafer 300 taken along line 6B-6B of FIG. 6A. FIG. 6C shows a cross-sectional view of wafer 300 taken along line 6C-6C of FIG. 6A. FIG. 6D shows a cross-sectional view of wafer 300 taken along line 6D-6D of FIG. 6A. FIG. 6E shows a cross-sectional view of wafer 300 taken along line 6E-6E of FIG. 6A. FIG. 6F shows a cross-sectional view of wafer 300 taken along line 6F-6F of FIG. 6A. FIG. 6G shows a cross-sectional view of wafer 300 taken along line 6G-6G of FIG. 6A. FIG. 6H shows a cross-sectional view of wafer 300 taken along line 6H-6H of FIG. 6A.

As shown in FIGS. 6A-6H, metal interconnect structure 316 includes an intermetal dielectric layer 610 that touches the metal-3 traces 530 and 532, and the metal-3 structures 540, 542, and 544. Metal interconnect structure 316 further includes a number of vias that lie over the integrated circuit regions 312 and the saw street region 314.

The vias that lie above the peripheral saw street region 314 include a number of vias 620 that extends into intermetal dielectric layer 610 to make electrical connections with metal-3 trace 530, a number of vias 622 that extends through intermetal dielectric layer 610 to make electrical connections with the metal-3 structures 542, and a number of vias 624 that extends through intermetal dielectric layer 610 to make electrical connections with the metal-3 structures 544. The vias that lie above each integrated circuit region 312 include a via 626 that extends through intermetal dielectric layer 610 to make an electrical connection with metal-3 structure 540.

As shown in FIGS. 6A-6H, metal interconnect structure 316 additionally includes a metal-4 trace 630 that touches the top surface of intermetal dielectric layer 610, and lies over the saw street region 314 and a portion of the integrated circuit regions 312 to extend over and make electrical connections to the vias 626 (to make electrical connections to the doped regions DLC).

Further, over the peripheral saw street region 314, metal interconnect structure 316 includes a number of metal-4 structures 632 that touches the top surface of intermetal dielectric layer 610 and makes electrical connections to the vias 622, a number of metal-4 structures 634 that touches the top surface of intermetal dielectric layer 610 and makes electrical connections to the vias 624, and a number of metal-4 structures 636 that touches the top surface of intermetal dielectric layer 610 and makes electrical connections to the vias 620.

As shown in FIGS. 6A-6H, wafer 300 also includes a number of trimmable resistors TR that lies above the integrated circuit regions 312. In the present example, the trimmable resistors TR are formed from the metal-4 layer, but can alternately be formed from any metal layer or as a salicided polysilicon line. In further accordance with the present invention, each trimmable resistor TR is formed with a material that can be electroplated without a seed layer, such as tantalum or an alloy of tantalum, e.g., TaCr and TaSiC.

Figure 7A:
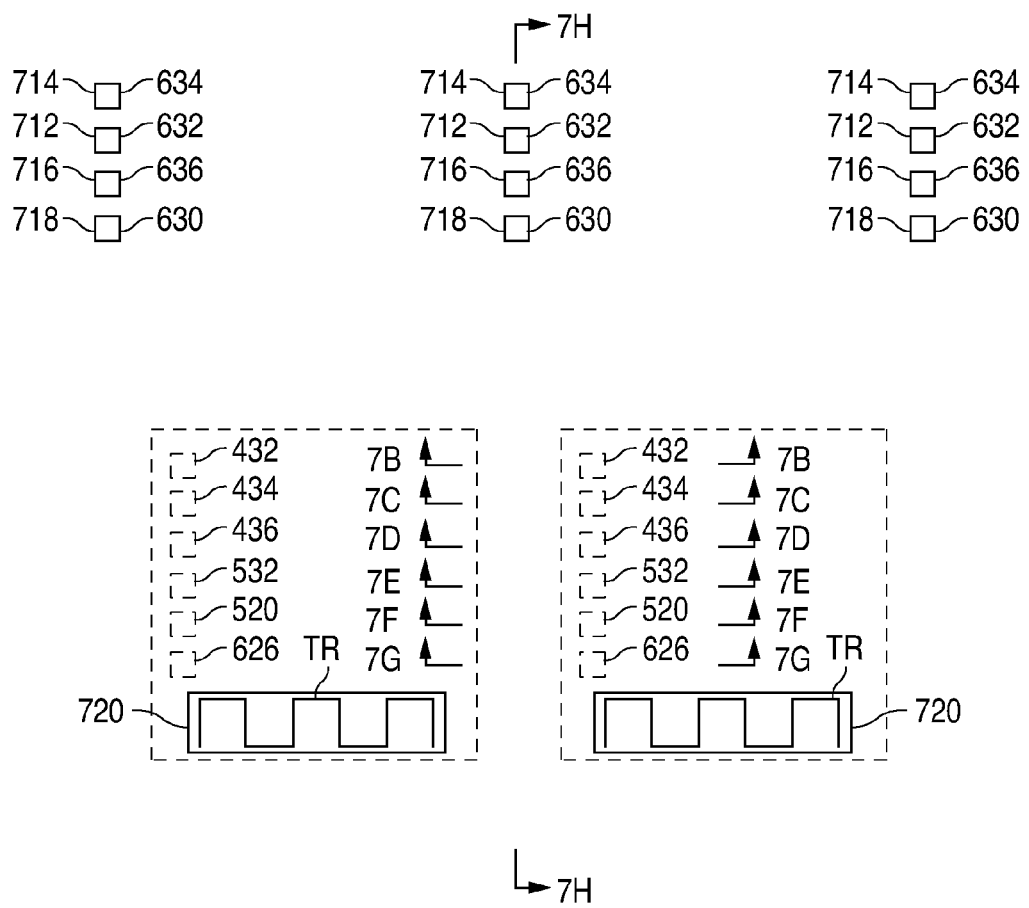
Figure 7B:
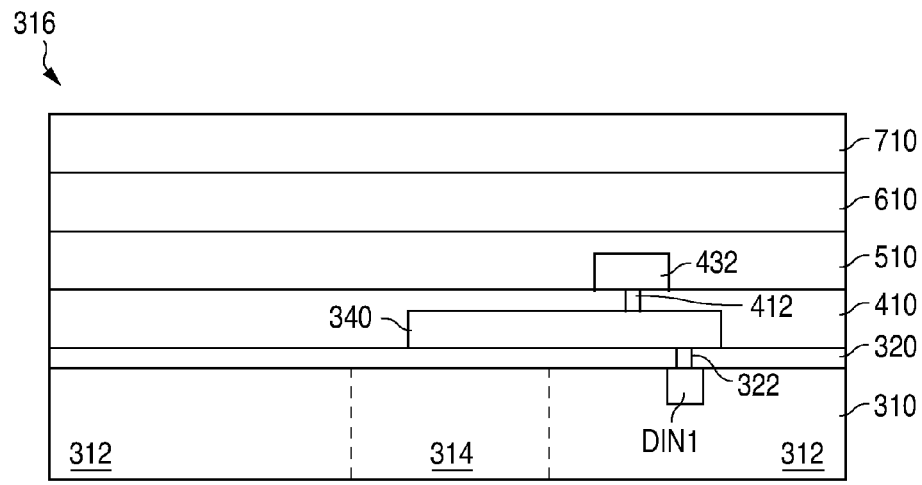
Figure 7C:
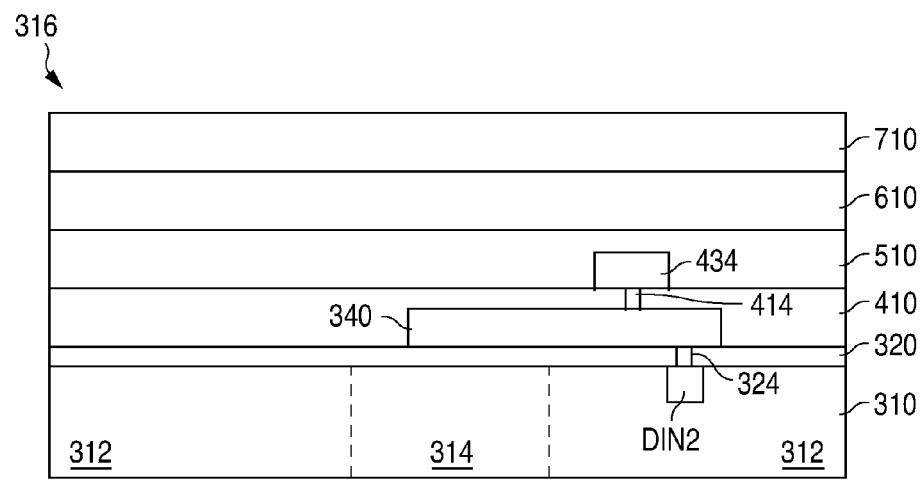
Figure 7D:
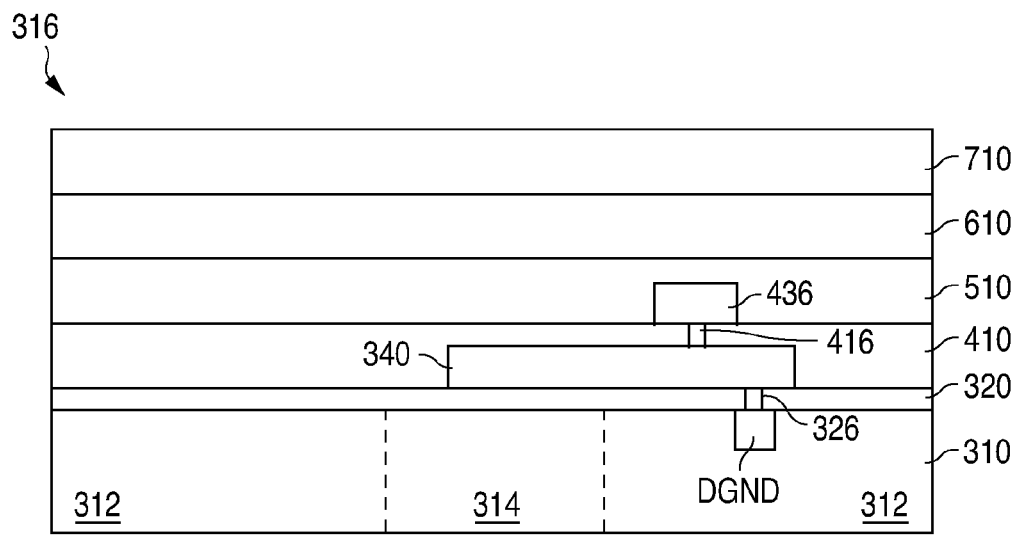
Figure 7E:
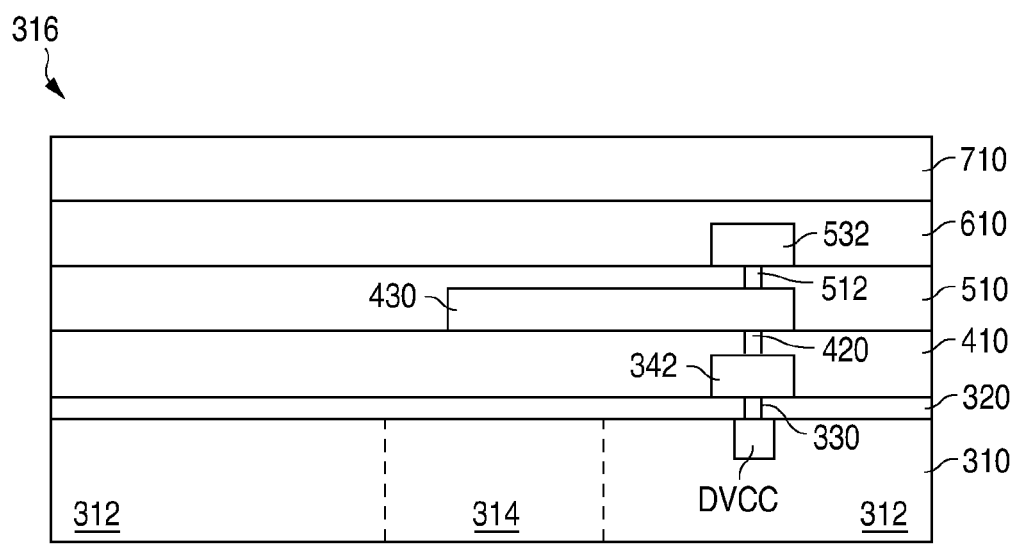
Figure 7F:
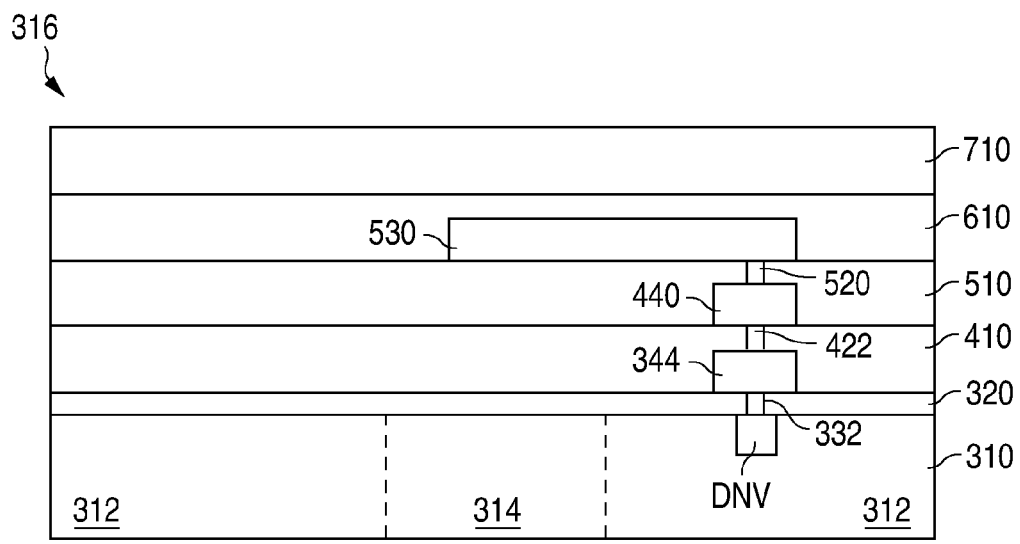
Figure 7G:
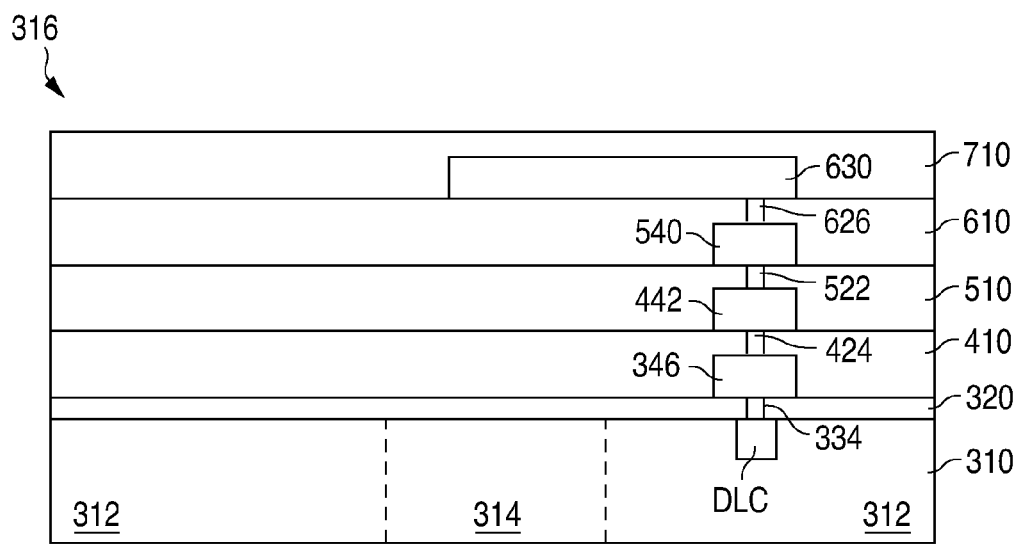
Figure 7H:
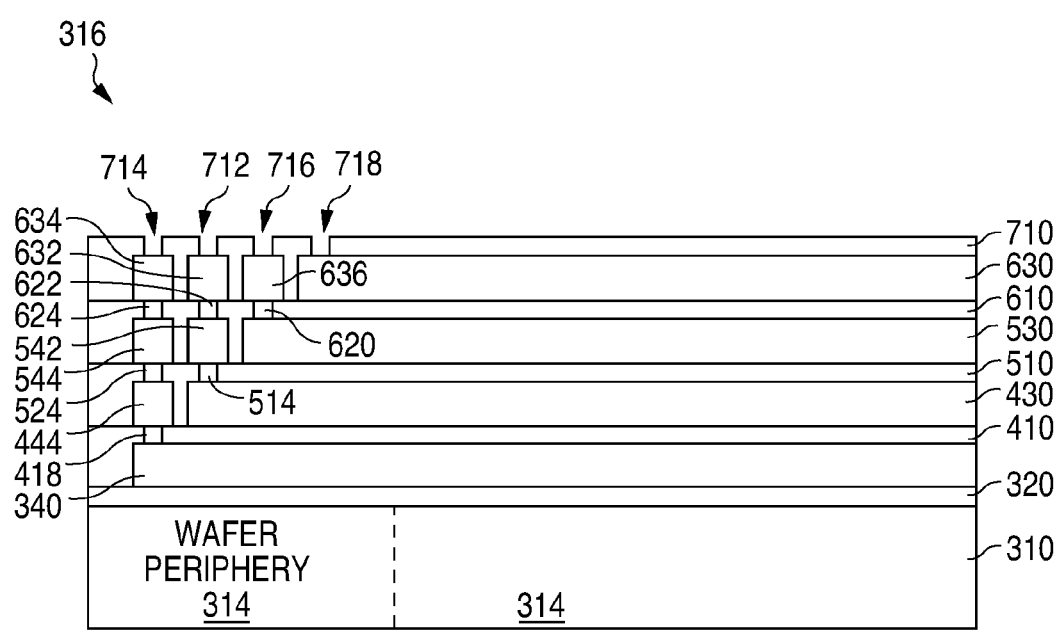

FIGS. 7A-7H show views that illustrate an example of wafer 300 following the formation of a top passivation layer in accordance with the present invention. FIG. 7A shows a plan view. FIG. 7B shows a cross-sectional view of wafer 300 taken along line 7B-7B of FIG. 7A. FIG. 7C shows a cross-sectional view of wafer 300 taken along line 7C-7C of FIG. 7A. FIG. 7D shows a cross-sectional view of wafer 300 taken along line 7D-7D of FIG. 7A. FIG. 7E shows a cross-sectional view of wafer 300 taken along line 7E-7E of FIG. 7A. FIG. 7F shows a cross-sectional view of wafer 300 taken along line 7F-7F of FIG. 7A. FIG. 7G shows a cross-sectional view of wafer 300 taken along line 7G-7G of FIG. 7A. FIG. 7H shows a cross-sectional view of wafer 300 taken along line 7H-7H of FIG. 7A.

As shown in FIGS. 7A-7H, metal interconnect structure 316 includes a passivation layer 710 has a number of openings over each integrated circuit region 312 and the saw street region 314. Passivation layer 710 touches intermetal dielectric layer 610, metal-4 trace 630, and the metal-4 structures 632, 634, and 636. The openings over the saw street region 314 include the openings 712 that expose the metal-4 structures 632, the openings 714 that expose the metal-4 structures 634, the openings 716 that expose the metal-4 structures 636, and the openings 718 that expose metal-4 trace 630.

The openings over the integrated circuit regions 312 include the openings 720 that expose the trimmable resistors TR. As noted above, the trimmable resistors TR can be formed as part of any metal layer or as a salicided polysilicon line as long as an opening can be formed through the passivation layer and the underlying dielectric layers to expose the trimmable resistor TR.

In accordance with the present invention, in the present example, the openings 712, 714, 716, 718, and 720 are the only openings in passivation layer 710. At this stage of fabrication, none of the pads which will eventually be exposed to provide electrical connections to the circuits are exposed.

Figure 8:
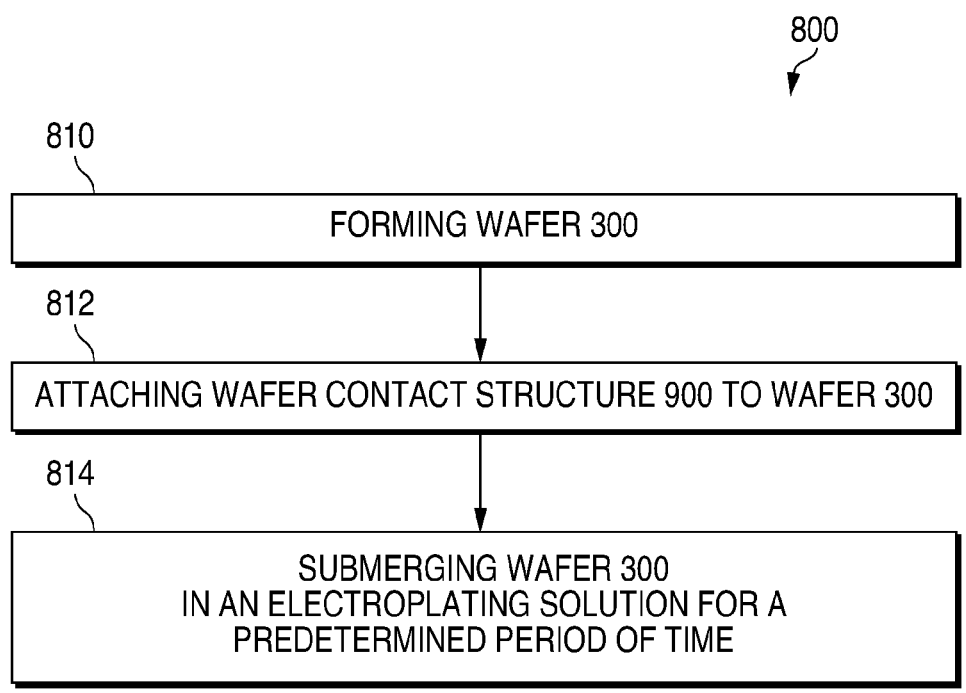
FIG. 8 is a flow chart illustrating an example of a trimming method 800 in accordance with the present invention.

FIG. 8 shows a flow chart that illustrates an example of a trimming method 800 in accordance with the present invention. As shown in FIG. 8, method 800 begins at 810 by forming wafer 300. Each of the elements of wafer 300, such as the passivation layer, the metal traces, the vias, the dielectric layers, the contacts, and the doped regions are well known elements that are formed in a conventional manner except as described below.

Conventionally, the metal traces are formed by depositing a layer of metal, forming a patterned photoresist layer over the layer of metal, and then etching the metal regions exposed by the patterned photoresist layer. The patterned photoresist layer, in turn, is conventionally formed by first depositing a layer of photoresist. Following this, a patterned black/clear glass plate known as a mask is positioned over an integrated circuit region 312. Next, a light is projected through the mask to soften the photoresist regions exposed by the light.

A stepper then positions the mask over a next integrated circuit region 312, and again projects the light through the mask to soften the photoresist regions exposed by the light. The stepper continues positioning the mask and projecting the light until the photoresist over each integrated circuit region 312 has been selectively exposed.

Thus, to form the traces and structures in the metal-1, metal-2, metal-3, and metal-4 layers that lie over the saw street region 314, the masks used to define the metal traces and structures are modified to selectively expose the layers of metal that lie over the saw street region 314. The via openings and passivation openings that lie over saw street region 314 are formed by similarly modifying the masks.

In accordance with the present invention, method 800 utilizes a wafer contact structure to provide voltages to wafer 300 when wafer 300 is submerged in an electroplating tank. In a conventional electroplating process, a wafer contact ring is attached to the periphery of a wafer before the wafer is placed in the electroplating tank.

The periphery of the wafer has an exposed seed layer, and the wafer contact ring has a number of spring-loaded contact pins that touch the seed layer when the wafer contact ring is attached to the wafer. During electroplating, a negative voltage, such as −5V, is applied to the seed layer through the contact pins. The negative voltage is commonly pulsed, such as with a clock signal, to provide more conformal plating.

In addition, a conventional wafer contact ring has a sleeve for each contact pin. The sleeves, which surround and protect the contact pins from the electroplating solution when submerged in an electroplating solution, are vacuum or otherwise attached to the exposed seed layer when the wafer contact ring is attached to the wafer.

Figure 9A:
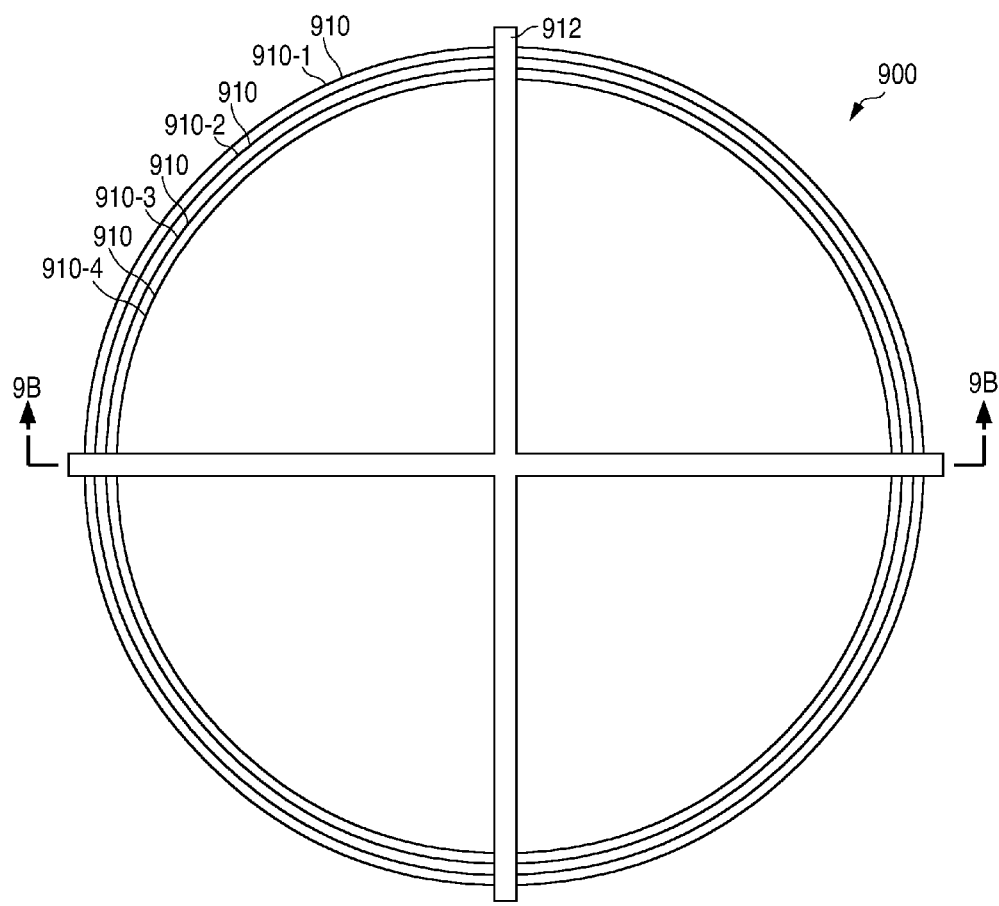
FIGS. 9A-9B are views illustrating an example of a wafer contact structure 900 in accordance with the present invention.
Figure 9B:
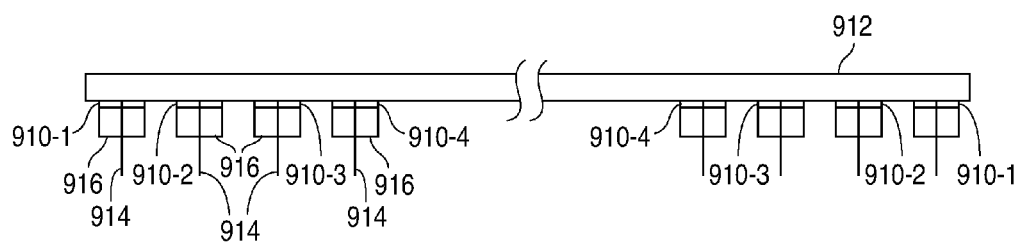

FIGS. 9A-9B show views that illustrates an example of a wafer contact structure 900 in accordance with the present invention. FIG. 9A shows a plan view, while FIG. 9B shows a cross-sectional view taken along line 9B-9B of FIG. 9A. As shown in FIGS. 9A-9B, wafer contact structure 900 includes a number of concentric wafer contact rings 910 that each lies over the peripheral region of wafer 300 (the spacing between the rings 910 in FIG. 9A is greatly expanded for clarity), and a support member 912 that is connected to each of the wafer contact rings 910. In the present example, four wafer contact rings 910 are illustrated, including wafer contact rings 910-1, 910-2, 910-3, and 910-4. The wafer contact rings 910 of the present invention can be implemented with conventional wafer contact rings with differing diameters that are connected together with support member 912.

As further shown in FIGS. 9A-9B, each wafer contact ring 910 includes a number of spring-loaded contact pins 914 and a number of sleeves 916 where each sleeve 916 surrounds a corresponding contact pin 914. In the present example, each of the contact pins 914 of wafer contact ring 910-1 is connected to ground, and each of the contact pins 914 of wafer contact ring 910-2 is connected to the power supply voltage VCC. In addition, each of the contact pins 914 of wafer contact ring 910-3 is connected to the negative plating voltage NV, and each of the contact pins 914 of wafer contact ring 910-4 is connected to the line control clock LC.

Figure 10:
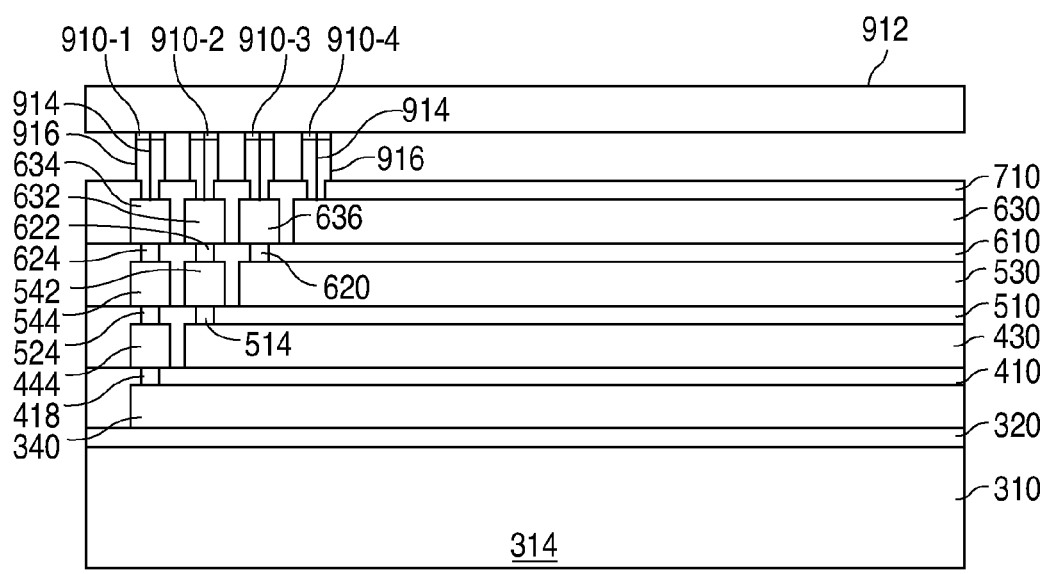
FIG. 10 is a cross-sectional view taken along line 7H-7H of FIG. 7A illustrating an example of wafer contact structure 900 attached to wafer 300 in accordance with the present invention.

Referring again to FIG. 8, after wafer 300 has been formed, method 800 moves to 812 to attach a wafer contact structure, such as structure 900 to wafer 300. FIG. 10 shows a cross-sectional view taken along line 7H-7H of FIG. 7A that illustrates an example of wafer contact structure 900 attached to wafer 300 in accordance with the present invention.

As shown in FIG. 10, when wafer contact structure 900 is attached to wafer 300, the contact pins 914 of wafer contact ring 910-1 extend into the openings 714 to provide ground to the metal-4 structures 634, and the contact pins 914 of wafer contact ring 910-2 extend into the openings 712 to provide the power supply voltage VCC to the metal-4 structures 632.

In addition, the contact pins 914 of wafer contact ring 910-3 extend into the openings 716 to provide the negative plating voltage NV to the metal-4 structures 636, and the contact pins 914 of wafer contact ring 910-4 extend into the openings 718 to provide the line clock signal LC to the metal-4 traces 630. Each of the contact pins 914 are protected by the sleeves 916 so that the passivation layer 710 and the trimmable resistors TR are the only top surface structures of wafer 300 that will be exposed to a plating solution.

After the wafer contact structure has been attached to wafer 300, the self-trimming circuit, e.g., the trimmable circuit 210 and the trim control circuit 220 illustrated in FIG. 2B, is electrically operational once the voltages and signals are applied to the wafer contact structure. Thus, in the present example, ground is applied to the doped regions DIN1 and DIN2, as well as to the doped regions DGND of each of the circuit elements, by way of wafer contact ring 910-1, and power is applied to the doped regions DVCC of each of the circuit elements by way of wafer contact ring 910-2. In addition, the negative plating voltage NV is applied to the doped region DNV by way of wafer contact ring 910-3, and the line control clock LC is applied to the doped region DLC by way of wafer contact ring 910-4.

Figure 11:
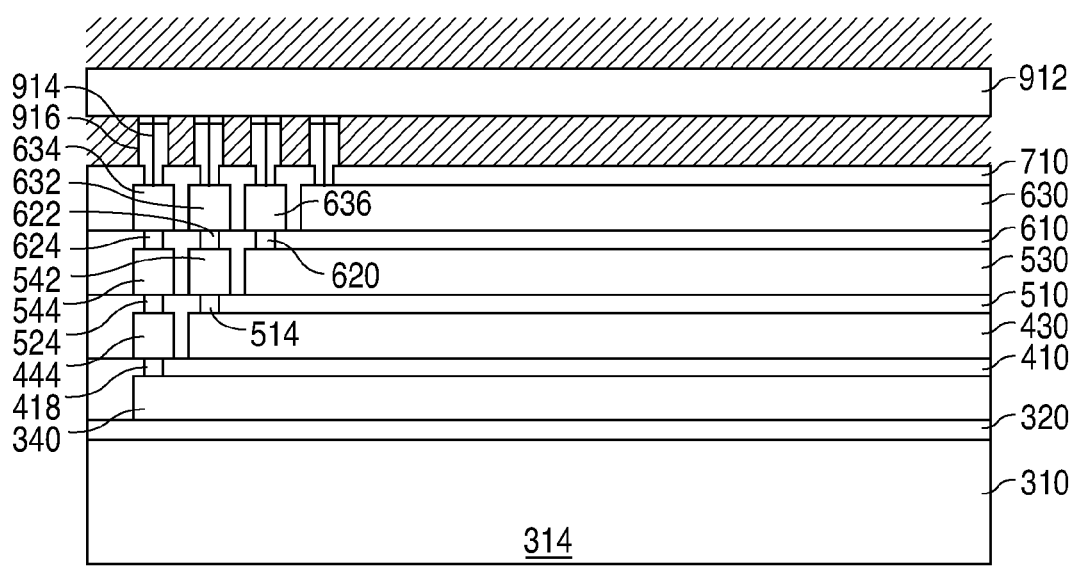
FIG. 11 is a cross-sectional view taken along line 7H-7H of FIG. 7A illustrating an example of the FIG. 10 structure submerged in a plating solution (represented by the cross-hatching) in accordance with the present invention.

Referring again to FIG. 8, after the wafer contact structure has been attached to wafer 300, method 800 moves to 814 to submerge wafer 300 in an electroplating solution for a predetermined period of time defined by the timer in method 250. Once submerged, the voltages and signals are applied to the wafer contact structure. FIG. 11 shows a cross-sectional view taken along line 7H-7H of FIG. 7A that illustrates an example of the FIG. 10 structure submerged in a plating solution (represented by the cross-hatching) in accordance with the present invention.

Conventionally, a wafer is electroplated by submerging the wafer in a plating solution known as an electrolyte that contains dissolved metal salts and other ions that allow a direct current to flow through the solution. In addition, a source of metal is placed into the plating solution and electrically connected to a positive voltage, while the wafer contact ring is electrically connected to a negative voltage. When the wafer is submerged in the plating solution, the negative voltage, which is placed on the seed layer at the periphery of the wafer by way of the wafer contact ring, causes the seed-covered structures on the wafer to be covered with metal from the source of metal.

In accordance with the present invention, wafer 300 is conventionally electroplated except that the negative plating voltage NV is periodically placed on the trimmable resistors TR as described above in method 250. As noted above, the trimmable resistors TR are exposed by the openings 720 in passivation layer 710, and formed from a material that can be electroplated without a seed layer.

Thus, as long as comparator 222 indicates that the actual output voltage VOUT differs from the reference voltage VREF (by more than the error tolerance), latch 226 stores a logic high which causes amplifier 240 to place the negative plating voltage NV on trimmable resistor TR each time the control line clock CL is low. Each time the negative plating voltage NV is placed on a trimmable resistor TR, metal from the metal source is electroplated onto the trimmable resistor TR, thereby reducing the resistance of the trimmable resistor TR.

However, once comparator 222 indicates that the actual output voltage VOUT equals the reference voltage VREF (or lies within the error tolerance), latch 226 stores a logic low which blocks amplifier 240 from again placing the negative plating voltage NV on trimmable resistor TR each time the control line clock CL is low.

Thus, plating stops for a trimmable resistor TR once the associated comparator 222 indicates that the actual output voltage VOUT equals the reference voltage VREF (or lies within the error tolerance), while plating continues for other trimmable resistors TR as long as the associated comparators 222 indicate that the actual output voltage VOUT differs from the reference voltage VREF (by more than the error tolerance) for these other trimmable resistors TR.

Thus, one of the advantages of the present invention is that the resistances of the trimmable resistors TR in the trimmable circuits 210 can be lowered in a batch process. In other words, a large number of wafers each having a large number of integrated circuits (e.g., 30,000) which, in turn, each have a number of trimmable resistors can all be trimmed during the same predetermined period of time (which can be empirically determined so that three sigma of all circuits are trimmed within the predetermined period of time).

This is because the electroplating process works on an individual resistor-by-resistor basis. Thus, the electroplating process stops for an individual trimmable resistor only when the actual output voltage of the associated trimmable circuit becomes equal to the reference voltage VREF, the predicted output voltage of the trimmable circuit.

As a result, the electroplating process stops at different times for different resistors, depending on how much the resistance needs to be lowered. Thus, each trimmable circuit 210 on wafer 300 is individually trimmed at the same time. As a result, the present invention substantially improves the throughput for matching resistor values.

After the predetermined period of time in method 250, wafer 300 is removed from the electroplating solution, and the wafer contact structure is removed from wafer 300. Following this, wafer 300 is cleaned and returned to processing so that openings can be formed in passivation layer 710 to expose the bond pads.

After this, wafer 300 is vertically and horizontally diced in a conventional manner along the saw street region 314 to form a large number of integrated circuits that each include a number of trimmable circuits 210 with matched resistors. The dicing process removes all of traces and structures formed from the metal-1, metal-2, metal-3, and metal-4 layers that lie over the saw street region 314, thereby electrically disconnecting the negative plating voltage NV and the line control clock CL from trim control circuit 220. (Resistor 236 also insures that transistor 242 remains turned off.)

In addition, the dicing process leaves exposed ends of the metal-1, metal-2, metal-3, and metal-4 traces. Further, the surfaces of the trimmable resistors TR remain exposed after the electroplating. These exposed ends and surfaces, however, pose no more of a problem than exposed bond pads, and are typically environmentally protected by an encapsulant during the packaging process.

In the present example, the trimmable resistors TR are always formed to have a greater resistance than the control resistors CR so that the resistances of the trimmable resistors TR can be reduced by the above-described method. Alternately, rather than electroplating the trimmable resistors TR to reduce the resistances, the trimmable resistors TR can also be anodized to increase the resistances. In this case, the trimmable resistors TR are always formed to have a smaller resistance than the control resistors CR so that the resistances of the trimmable resistors TR can be increased.

Figure 12:
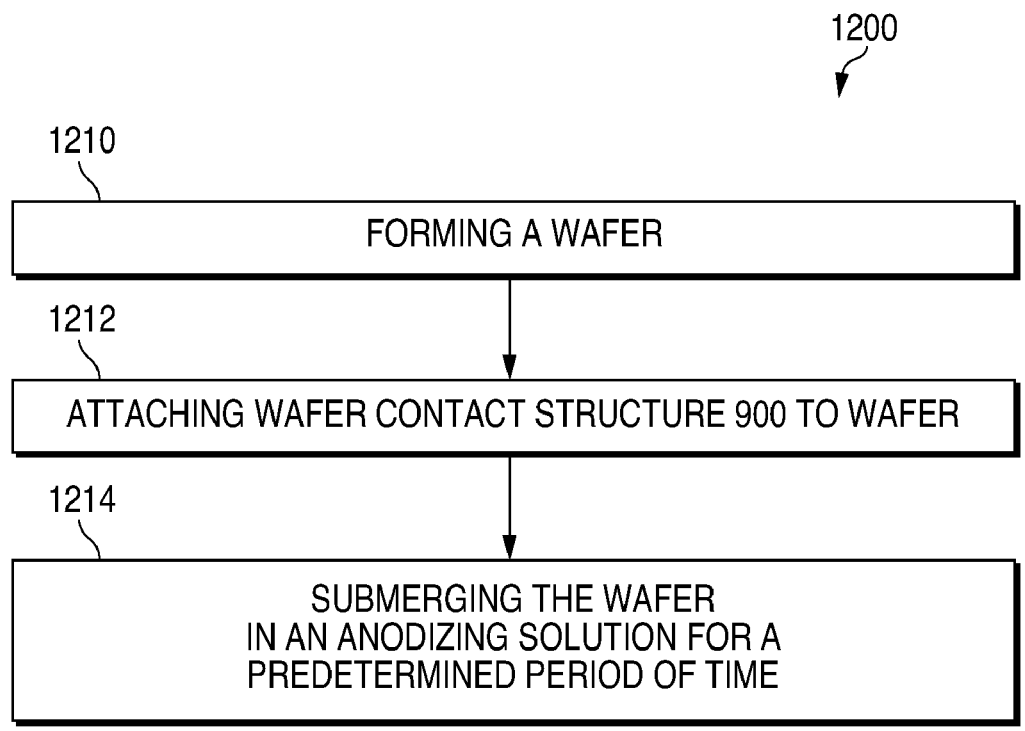
FIG. 12 is a flow chart illustrating an example of a trimming method 1200 in accordance with an alternate embodiment of the present invention.

FIG. 12 shows a flow chart that illustrates an example of a trimming method 1200 in accordance with an alternate embodiment of the present invention. As shown in FIG. 12, method 1200 begins at 1210 by forming a wafer. The wafer is the same as wafer 300 except that amplifier 240 of trim control circuit 220 is changed to output a positive anodizing voltage in response to an input logic high rather than outputting the negative plating voltage NV in response to an input logic high.

In accordance with the present invention, each trimmable resistor TR is formed with a material that can be anodized, such as tantalum or an alloy of tantalum, e.g., TaCr and TaSiC. After the wafer has been formed, method 1200 next moves to 1212 to attach wafer contact structure 900 to the wafer. After the wafer contact structure has been attached to the wafer, the self-trimming circuit is electrically operational once voltages and signals are applied to the wafer contact structure.

After the wafer contact structure has been attached to the wafer, method 1200 moves to 1214 to submerge the wafer in an anodizing solution for a predetermined period of time. The anodizing solution can be implemented with a weak acid solution, such as citric acid, tartaric acid, malic acid, lactic acid, or sulphurous acid. Once submerged, the voltages and signals are applied to the wafer contact structure.

In addition, a conductive pole is placed into the weak acid solution and electrically connected to a negative voltage. Further, a positive anodizing voltage is periodically placed on the trimmable resistors TR in the same manner as described above. As noted above, the trimmable resistors TR are exposed by the openings 720 in passivation layer 710, and formed from a material that can be anodized.

Thus, as long as comparator 222 indicates that the actual output voltage VOUT differs from the reference voltage VREF (by more than the error tolerance), latch 226 stores a logic high which causes amplifier 240 to place the positive anodizing voltage on trimmable resistor TR each time the control line clock CL is low. Each time the positive anodizing voltage is placed on a trimmable resistor TR, trimmable resistor TR is oxidized, thereby increasing the resistance of the trimmable resistor TR.

However, once comparator 222 indicates that the actual output voltage VOUT equals the reference voltage VREF (or lies within the error tolerance), latch 226 stores a logic low which blocks amplifier 240 from again placing the positive anodizing voltage on trimmable resistor TR each time the control line clock CL is low.

Thus, anodizing stops for a trimmable resistor TR once the associated comparator 222 indicates that the actual output voltage VOUT equals the reference voltage VREF (or lies within the error tolerance), while anodizing continues for other trimmable resistors TR as long as the associated comparators 222 indicate that the actual output voltage VOUT differs from the reference voltage VREF (by more than the error tolerance) for these other trimmable resistors TR.

Thus, one of the advantages of the present invention is that the resistances of the trimmable resistors TR in the trimmable circuits 210 can be raised in a batch process. In other words, a large number of wafers each having a large number of integrated circuits (e.g., 30,000) which, in turn, each have a number of trimmable resistors can all be trimmed during the same predetermined period of time (which can be empirically determined so that three sigma of all circuits are trimmed within the predetermined period of time).

This is because the anodizing process works on an individual resistor-by-resistor basis. Thus, the anodizing process stops for an individual trimmable resistor only when the actual output voltage of the associated trimmable circuit becomes equal to the reference voltage VREF, the predicted output voltage of the trimmable circuit.

As a result, the anodizing process stops at different times for different resistors, depending on how much the resistance needs to be raised. Thus, each trimmable circuit 210 on the wafer is individually trimmed at the same time. As a result, the present invention substantially improves the throughput for matching resistor values.

After the predetermined period of time, the wafer is removed from the anodizing solution, and the wafer connect structure is removed from the wafer. Following this, the wafer is cleaned and returned to processing so that openings can be formed in passivation layer 710 to expose the bond pads.

After this, the wafer is vertically and horizontally diced in a conventional manner along the saw street region 314 to form a large number of integrated circuits that each include a number of trimmable circuits 210 with matched resistors. As before, the dicing process removes all of traces and structures formed from the metal-1, metal-2, metal-3, and metal-4 layers that lie over the saw street region 314, thereby electrically disconnecting the positive plating voltage and the line control clock CL from the trim control circuit. (Resistor 236 also insures that transistor 242 remains turned off.)

As noted above, trimmable circuit 210 can be implemented with any circuit where, in response to known input conditions, the value or state of a changeable circuit element within trimmable circuit 210 determines how closely the actual voltage or state output from trimmable circuit 210 matches the predicted voltage or state which should be output from trimmable circuit 210.

Figure 13:
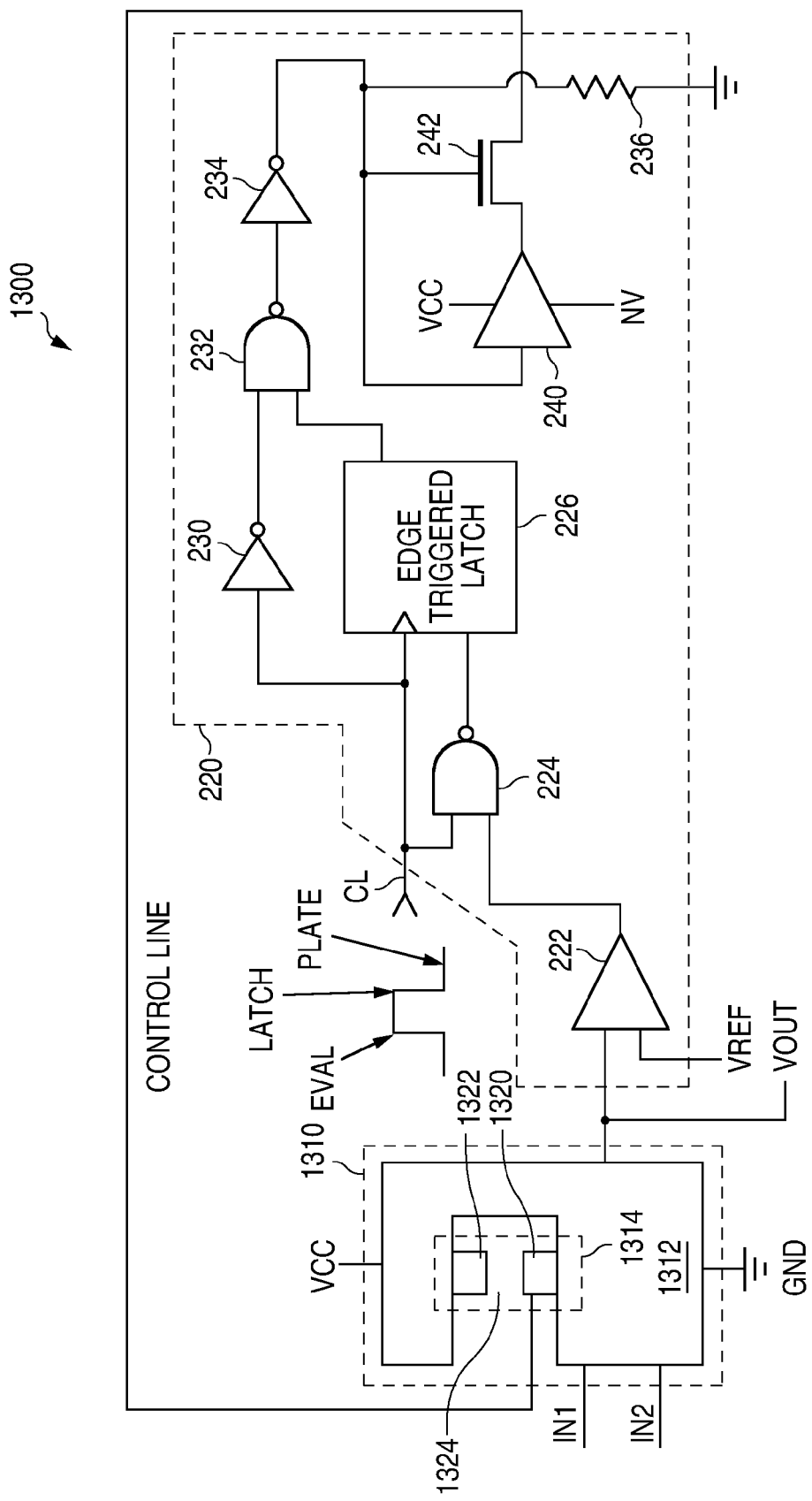
FIG. 13 is a schematic view illustrating an example of a self-trimming circuit 1300 in further accordance with the present invention.

FIG. 13 shows a schematic view that illustrates an example of a self-trimming circuit 1300 in further accordance with the present invention. As shown in FIG. 13, self-trimming circuit 1300 includes a trimmable circuit 1310, and trim control circuit 220 that is connected to trimmable circuit 1310. In the FIG. 13 example, trimmable circuit 1310 includes an electronic circuit 1312 that receives an input signal IN1 and an input signal IN2, and generates an output voltage VOUT.

Further, trimmable circuit 1310 also includes an anti-fuse 1314 that is connected to electronic circuit 1312. Anti-fuse 1314 has a first metal side 1320 and a second metal side 1322 that is separated from the first metal side 1320 by a non-conductive region 1324. In addition, the first metal side 1320 of anti-fuse 1314 is connected to receive the negative plating voltage NV.

Figure 14:
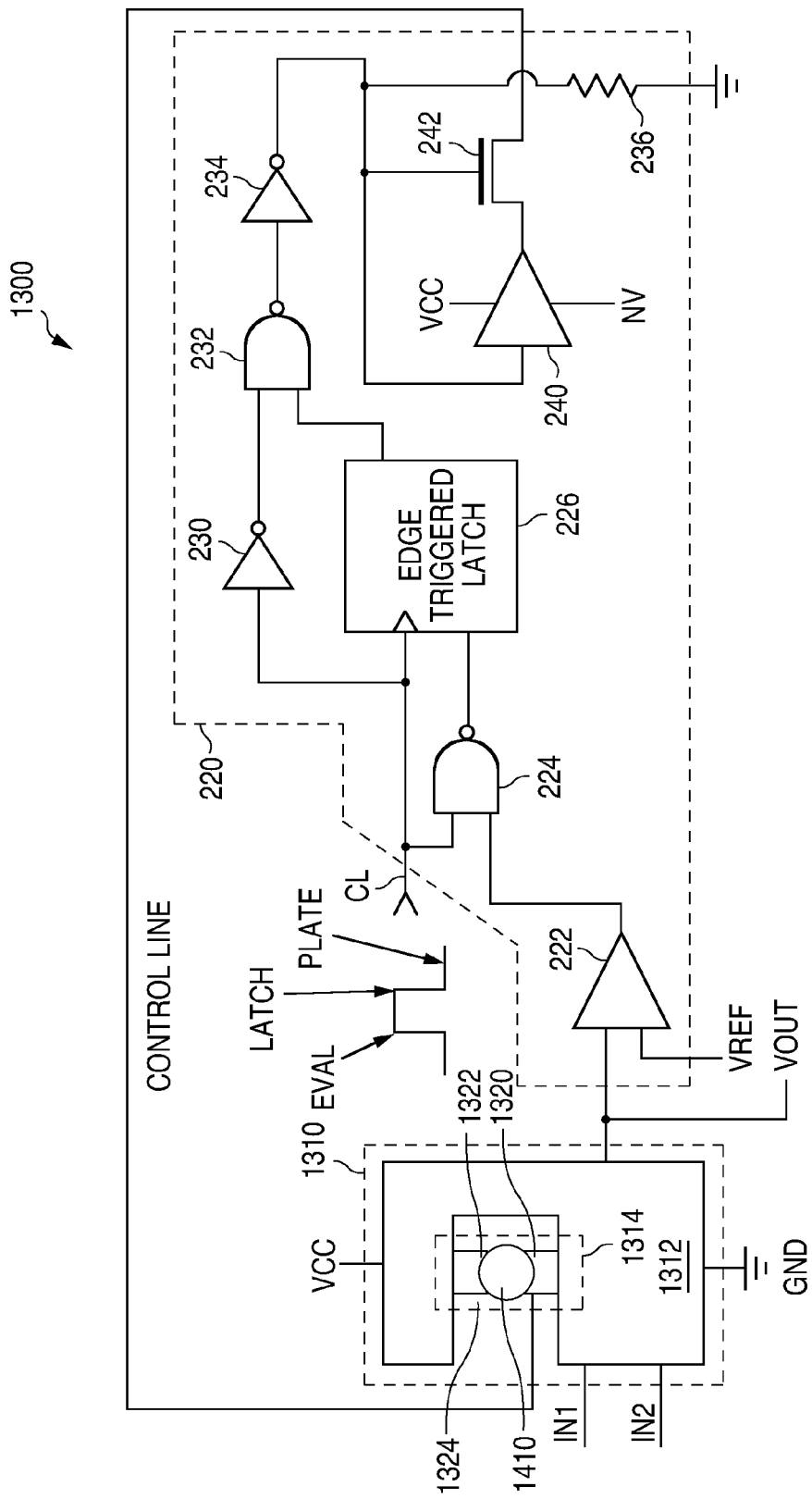
FIG. 14 is a schematic view illustrating a further example of self-trimming circuit 1300 in accordance with the present invention.

In the present example, in response to known input conditions, when the actual output voltage VOUT and the predicted output voltage are unequal, the actual output voltage VOUT and the predicted output voltage can be set to be equal by connecting anti-fuse 1314. FIG. 14 is a schematic view illustrating a further example of self-trimming circuit 1300 in accordance with the present invention.

As shown in FIG. 14, first metal side 1320 and second metal side 1322 of anti-fuse 1314 can be electrically connected together with a plated metal layer 1410 using method 800 of the present invention, where a number of self-trimming circuits 1300 are formed on a number of integrated circuit regions 312 of wafer 300.

It should be understood that the above descriptions are examples of the present invention, and that various alternatives of the invention described herein may be employed in practicing the invention. One example is that more than four layers of metal and four wafer contact rings 910 can be used to accommodate additional signals or voltages. For example, if the FIG. 2C example were implemented in wafer 300, metal-1 trace 340 would only be connected to contact 326, while metal-2 trace 430 would be electrically connected to doped regions DIN1 and DIN2 as well as DVCC. Further, a fifth layer of metal and a fifth wafer contact ring 910 would be required to provide the one-half power supply voltage 0.5 VCC to the reference voltage VREF.

In addition, the present invention can be applied at any stage during the formation of metal interconnect structure 316 as long as the devices have been connected together so that the self-trimming circuit 200 can function. Thus, it is intended that the following claims define the scope of the invention and that structures and methods within the scope of these claims and their equivalents be covered thereby.

What is claimed is:

1. A wafer comprising:
   a substrate having an array of integrated circuit regions, and a saw street region that laterally surrounds each integrated circuit region;
   a trimmable circuit formed in each integrated circuit region of the substrate, each trimmable circuit including a trimmable circuit element;
   a trim control circuit formed in each integrated circuit region of the substrate, each trim control circuit being connected to a corresponding trimmable circuit; and
   a metal interconnect structure formed over each integrated circuit region to touch the substrate, each metal interconnect structure having an opening that exposes a trimmable circuit element.

2. The wafer of claim 1 and further comprising a first metal trace lying over the integrated circuit regions and the saw street regions, and being electrically connected to each trimmable circuit and each trim control circuit.

3. The wafer of claim 2 and further comprising a second metal trace lying over the integrated circuit regions and the saw street regions, and being electrically connected to each trimmable circuit and each trim control circuit.

4. The wafer of claim 3 wherein the second metal trace lies vertically over the first metal trace in the saw street region.

5. The wafer of claim 3 wherein the first metal trace is electrically isolated from the second metal trace.

* * * * *